(12) United States Patent
Kishii

(10) Patent No.: US 7,637,270 B2
(45) Date of Patent: Dec. 29, 2009

(54) METHOD OF WASHING A POLISHED OBJECT

(75) Inventor: Sadahiro Kishii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 486 days.

(21) Appl. No.: 11/474,403

(22) Filed: Jun. 26, 2006

(65) Prior Publication Data

US 2006/0241006 A1 Oct. 26, 2006

Related U.S. Application Data

(62) Division of application No. 10/440,299, filed on May 19, 2003, now abandoned.

(30) Foreign Application Priority Data

May 21, 2002 (JP) ............................. 2002-146126

(51) Int. Cl.
*H01L 21/02* (2006.01)
(52) U.S. Cl. ................ 134/1.3; 134/2; 134/3; 510/175
(58) Field of Classification Search ................ 134/1.3, 134/2, 3; 510/175
See application file for complete search history.

(56) References Cited

U.S. PATENT DOCUMENTS

| | | | |
|---|---|---|---|
| 5,611,829 | A | 3/1997 | Monroe et al. |
| 5,763,325 | A | 6/1998 | Kishii et al. |
| 5,877,089 | A | 3/1999 | Kishii et al. |
| 6,086,454 | A | 7/2000 | Watanabe et al. |
| 6,114,247 | A | 9/2000 | Nakamura et al. |
| 6,258,140 | B1 | 7/2001 | Shemo et al. |
| 6,270,395 | B1 | 8/2001 | Towery et al. |
| 6,277,753 | B1 * | 8/2001 | Mullee et al. ............... 438/692 |
| 6,332,831 | B1 | 12/2001 | Shemo et al. |
| 6,423,125 | B1 | 7/2002 | Ishibashi et al. |
| 6,508,953 | B1 | 1/2003 | Li et al. |
| 6,550,278 | B2 | 4/2003 | Mitani et al. |
| 6,616,514 | B1 | 9/2003 | Edelbach et al. |
| 6,702,954 | B1 | 3/2004 | Her et al. |
| 6,730,644 | B1 | 5/2004 | Ishikawa et al. |
| 6,740,589 | B2 | 5/2004 | Shimazu et al. |
| 2002/0098701 | A1 | 7/2002 | Hasegawa |
| 2003/0119319 | A1 | 6/2003 | Sinha et al. |

(Continued)

FOREIGN PATENT DOCUMENTS

JP  63-144945  6/1988

(Continued)

OTHER PUBLICATIONS

Japanese Office Action dated Dec. 11, 2007 of 2002-146126.

(Continued)

*Primary Examiner*—Gregory E Webb
(74) *Attorney, Agent, or Firm*—Westerman, Hattori, Daniels & Adrian, LLP

(57) ABSTRACT

An abrasive includes abrasive grains, a solvent, and an additive. $MnO_2$, $Mn_2O_3$, $Mn_3O_4$, MnO or a mixture thereof as the abrasive grains, $H_2O_2$ as the solvent, and $HNO_3$, an organic acid, $H_2O_2$, etc., as the additive are employed. The abrasive is solidified with cooling, etc. The abrasive and the additive can be supplied to a polishing apparatus through separate routes.

2 Claims, 20 Drawing Sheets

GATE ELECTRODE MATERIAL OF N-CHANNEL MOS-TYPE SEMICONDUCTOR DEVICE
IDEAL VALUE 4.05eV

| ELECTRODE MATERIAL | WORK FUNCTION(eV) | |
|---|---|---|
| | TEXT 1 | TEXT 2 |
| Al | 4.13 | 4.19 |
| Ta | 4.19 | 4.22 |
| Mo | 4.45 | 4.21 |
| Ti | 4.14 | |
| Hf | 3.90 | |
| TaN | 4.05 | |
| Nb | 4.15 | 4.37 |
| Fe | | 4.24 |
| Ag | | 4.44 |
| W | | 4.55 |

MATERIAL FOR GATE ELECTRODE OF P-CHANNEL MOS-TYPE SEMICONDUCTOR DEVICE
IDEAL VALUE 5.17eV

| ELECTRODE MATERIAL | WORK FUNCTION(eV) | |
|---|---|---|
| | TEXT 1 | TEXT 2 |
| $RuO_2$ | 4.90 | |
| Ir | 5.35 | |
| Pt | 5.65 | 5.63 |
| WN | 5.00 | |
| $Mo_2N$ | 5.33 | |
| Ni | | 5.25 |
| Pd | | 4.95 |

U.S. PATENT DOCUMENTS

2003/0153255 A1   8/2003   Hasegawa et al.

FOREIGN PATENT DOCUMENTS

| JP | 08-229829 | 9/1996 |
| JP | 8-255773 | 10/1996 |
| JP | 9-22887 | 1/1997 |
| JP | 9-22888 | 1/1997 |
| JP | 10-71571 A | 3/1998 |
| JP | 10-180619 A | 7/1998 |
| JP | 11-207632 | 8/1999 |
| JP | 11-251280 | 9/1999 |
| JP | 2000-6031 | 1/2000 |
| JP | 2000-91284 | 3/2000 |
| JP | 2000-190204 | 7/2000 |
| JP | 2001-007071 | 1/2001 |
| JP | 2001-9731 | 1/2001 |

OTHER PUBLICATIONS

Office Action dated May 27, 2008 of JP 2002-146126.
Office Action dated Sep. 16, 2008 of JP 2002-146126.

* cited by examiner

FIG.1A   GATE ELECTRODE MATERIAL OF N-CHANNEL
MOS-TYPE SEMICONDUCTOR DEVICE
IDEAL VALUE 4.05eV

| ELECTRODE MATERIAL | WORK FUNCTION(eV) | |
|---|---|---|
| | TEXT 1 | TEXT 2 |
| Al | 4.13 | 4.19 |
| Ta | 4.19 | 4.22 |
| Mo | 4.45 | 4.21 |
| Ti | 4.14 | |
| Hf | 3.90 | |
| TaN | 4.05 | |
| Nb | 4.15 | 4.37 |
| Fe | | 4.24 |
| Ag | | 4.44 |
| W | | 4.55 |

FIG.1B   MATERIAL FOR GATE ELECTRODE OF P-CHANNEL
MOS-TYPE SEMICONDUCTOR DEVICE
IDEAL VALUE 5.17eV

| ELECTRODE MATERIAL | WORK FUNCTION(eV) | |
|---|---|---|
| | TEXT 1 | TEXT 2 |
| RuO2 | 4.90 | |
| Ir | 5.35 | |
| Pt | 5.65 | 5.63 |
| WN | 5.00 | |
| Mo2N | 5.33 | |
| Ni | | 5.25 |
| Pd | | 4.95 |

FIG.1C   IDEAL VALUE FOR SINGLE ELECTRODE :4.61eV

| ELECTRODE MATERIAL | WORK FUNCTION(eV) | |
|---|---|---|
| | TEXT 1 | TEXT 2 |
| W | 4.52 | |
| Ru | 4.68 | 4.86 |
| Co | 4.45 | |
| Cr | 4.5 | |
| Pd | 4.9 | |
| WNx | 4.6 | |
| TiN | 4.7 | |

| ABRASIVE | ABRASIVE GRAIN | STATE OF ABRASIVE | POLISHING CONDITION | WORK | V (μm/min) | MASS OF ABRASIVE GRAINS NECESSARY FOR POLISHING BY 1μm(g) |
|---|---|---|---|---|---|---|
| SAMPLE 61 | MnO₂ | SOLID | 61 | SiO2(61) | 0.13 | 6.15 |
| | | | 61 | POLYSILICON(62) | 0.15 | 5.33 |
| SAMPLE 62 | Mn₂O₃ | SOLID | 61 | SiO2(61) | 0.42 | 1.90 |
| | | | 61 | POLYSILICON(62) | 0.49 | 1.63 |
| SAMPLE 63 | Mn₃O₄ | SOLID | 61 | SiO2(61) | 0.29 | 2.76 |
| | | | 61 | POLYSILICON(62) | 0.32 | 2.50 |
| SAMPLE 64 | MnO | SOLID | 61 | SiO2(61) | 0.11 | 7.27 |
| | | | 61 | POLYSILICON(62) | 0.13 | 6.15 |
| SAMPLE 65 (COMPARISON) | SiO₂ | SOLID | 61 | SiO2(61) | 0.001 | 800 |
| | | | 61 | POLYSILICON(62) | 0.001 | 800 |
| SAMPLE 66 (COMPARISON) | MnO₂ | LIQUID | 62 | SiO2(61) | 0.11 | 90.9 |
| | | | 62 | POLYSILICON(62) | 0.14 | 71.4 |
| SAMPLE 67 (COMPARISON) | Mn₂O₃ | LIQUID | 62 | SiO2(61) | 0.35 | 28.6 |
| | | | 62 | POLYSILICON(62) | 0.45 | 22.2 |
| SAMPLE 68 (COMPARISON) | Mn₃O₄ | LIQUID | 62 | SiO2(61) | 0.24 | 41.7 |
| | | | 62 | POLYSILICON(62) | 0.29 | 34.5 |
| SAMPLE 69 (COMPARISON) | MnO | LIQUID | 62 | SiO2(61) | 0.09 | 111.1 |
| | | | 62 | POLYSILICON(62) | 0.12 | 83.3 |
| SAMPLE 6A (COMPARISON) | SiO₂ | LIQUID | 62 | SiO2(61) | 0.08 | 150 |
| | | | 62 | POLYSILICON(62) | 0.15 | 80 |

FIG.7

| ABRASIVE | ABRASIVE GRAIN | SOLID CONTENT (wt%) | ADDITIVE | STATE OF ABRASIVE | HOLD-BACK AGENT |
|---|---|---|---|---|---|
| 71 | MnO$_2$ | 20 | HNO$_3$ | SOLID | ICE |
| 72 | | | POTASSIUM PHTHALATE | SOLID | ICE |
| 73 | | | ORTHO-METHYLBENZOIC ACID | SOLID | ICE |
| 74 | | | NONE | SOLID | ICE |
| 75 | Mn$_2$O$_3$ | 20 | HNO$_3$ | SOLID | ICE |
| 76 | | | POTASSIUM PHTHALATE | SOLID | ICE |
| 77 | | | ORTHO-METHYLBENZOIC ACID | SOLID | ICE |
| 78 | | | NONE | SOLID | ICE |
| 79 | Mn$_3$O$_4$ | 20 | HNO$_3$ | SOLID | ICE |
| 7A | | | POTASSIUM PHTHALATE | SOLID | ICE |
| 7B | | | ORTHO-METHYLBENZOIC ACID | SOLID | ICE |
| 7C | | | NONE | SOLID | ICE |
| 7D | MnO | 20 | HNO$_3$ | SOLID | ICE |
| 7E | | | POTASSIUM PHTHALATE | SOLID | ICE |
| 7F | | | ORTHO-METHYLBENZOIC ACID | SOLID | ICE |
| 7G | | | NONE | SOLID | ICE |
| 7H COMPARISON | MnO$_2$ | 10 | HNO$_3$ | LIQUID | NONE |
| 7I COMPARISON | | | POTASSIUM PHTHALATE | LIQUID | NONE |
| 7J COMPARISON | | | ORTHO-METHYLBENZOIC ACID | LIQUID | NONE |
| 7K COMPARISON | | | NONE | LIQUID | NONE |
| 7L COMPARISON | Mn$_2$O$_3$ | 10 | HNO$_3$ | LIQUID | NONE |
| 7M COMPARISON | | | POTASSIUM PHTHALATE | LIQUID | NONE |
| 7N COMPARISON | | | ORTHO-METHYLBENZOIC ACID | LIQUID | NONE |
| 7O COMPARISON | | | NONE | LIQUID | NONE |
| 7P COMPARISON | Mn$_3$O$_4$ | 10 | HNO$_3$ | LIQUID | NONE |
| 7Q COMPARISON | | | POTASSIUM PHTHALATE | LIQUID | NONE |
| 7R COMPARISON | | | ORTHO-METHYLBENZOIC ACID | LIQUID | NONE |
| 7S COMPARISON | | | NONE | LIQUID | NONE |
| 7T COMPARISON | MnO | 10 | HNO$_3$ | LIQUID | NONE |
| 7U COMPARISON | | | POTASSIUM PHTHALATE | LIQUID | NONE |
| 7V COMPARISON | | | ORTHO-METHYLBENZOIC ACID | LIQUID | NONE |
| 7W COMPARISON | | | NONE | LIQUID | NONE |

FIG. 8

| ABRASIVE | ABRASIVE GRAIN | ADDITIVE | STATE OF ABRASIVE | POLISHING CONDITION | VCu (μm/min) | VSiO2 (μm/min) | GRAINS NECESSARY FOR POLISHING BY 1 μm (g) |
|---|---|---|---|---|---|---|---|
| 71 | MnO2 | HNO3 | SOLID | 71 | 0.3-0.55 | EQUAL TO OR LESS THAN 0.02 | 1.45-2.67 |
| 72 | | POTASSIUM PHTHALATE | SOLID | 71 | 0.3-0.55 | EQUAL TO OR LESS THAN 0.02 | 1.45-2.67 |
| 73 | | ORTHO-METHYLBENZOIC ACID | SOLID | 71 | 0.3-0.55 | EQUAL TO OR LESS THAN 0.02 | 1.45-2.67 |
| 74 | | NONE | SOLID | 71 | EQUAL TO OR LESS THAN 0.01 | 0.42 | 80 |
| 75 | Mn2O3 | HNO3 | SOLID | 71 | 0.3-0.55 | EQUAL TO OR LESS THAN 0.02 | 1.45-2.67 |
| 76 | | POTASSIUM PHTHALATE | SOLID | 71 | 0.3-0.55 | EQUAL TO OR LESS THAN 0.02 | 1.45-2.67 |
| 77 | | ORTHO-METHYLBENZOIC ACID | SOLID | 71 | 0.3-0.55 | EQUAL TO OR LESS THAN 0.02 | 1.45-2.67 |
| 78 | | NONE | SOLID | 71 | EQUAL TO OR LESS THAN 0.01 | 0.29 | 80 |
| 79 | Mn3O4 | HNO3 | SOLID | 71 | 0.3-0.55 | EQUAL TO OR LESS THAN 0.02 | 1.45-2.67 |
| 7A | | POTASSIUM PHTHALATE | SOLID | 71 | 0.3-0.55 | EQUAL TO OR LESS THAN 0.02 | 1.45-2.67 |
| 7B | | ORTHO-METHYLBENZOIC ACID | SOLID | 71 | 0.3-0.55 | EQUAL TO OR LESS THAN 0.02 | 1.45-2.67 |
| 7C | | NONE | SOLID | 71 | EQUAL TO OR LESS THAN 0.01 | 0.11 | 80 |
| 7D | MnO | HNO3 | SOLID | 71 | 0.3-0.55 | EQUAL TO OR LESS THAN 0.02 | 1.45-2.67 |
| 7E | | POTASSIUM PHTHALATE | SOLID | 71 | 0.3-0.55 | EQUAL TO OR LESS THAN 0.02 | 1.45-2.67 |
| 7F | | ORTHO-METHYLBENZOIC ACID | SOLID | 71 | 0.3-0.55 | EQUAL TO OR LESS THAN 0.02 | 1.45-2.67 |
| 7G | | NONE | SOLID | 71 | EQUAL TO OR LESS THAN 0.01 | 0.13 | 80 |
| 7H | MnO2 | HNO3 | LIQUID | 72 | 0.22-0.27 | EQUAL TO OR LESS THAN 0.01 | 37.0-45.5 |
| 7I | | POTASSIUM PHTHALATE | LIQUID | 72 | 0.22-0.27 | EQUAL TO OR LESS THAN 0.01 | 37.0-45.5 |
| 7J | | ORTHO-METHYLBENZOIC ACID | LIQUID | 72 | 0.22-0.27 | EQUAL TO OR LESS THAN 0.01 | 37.0-45.5 |
| 7K | | NONE | LIQUID | 72 | EQUAL TO OR LESS THAN 0.01 | 0.35 | 80 |
| 7L | Mn2O3 | HNO3 | LIQUID | 72 | 0.22-0.27 | EQUAL TO OR LESS THAN 0.01 | 37.0-45.5 |
| 7M | | POTASSIUM PHTHALATE | LIQUID | 72 | 0.22-0.27 | EQUAL TO OR LESS THAN 0.01 | 37.0-45.5 |
| 7N | | ORTHO-METHYLBENZOIC ACID | LIQUID | 72 | 0.22-0.27 | EQUAL TO OR LESS THAN 0.01 | 37.0-45.5 |
| 7O | | NONE | LIQUID | 72 | EQUAL TO OR LESS THAN 0.01 | 0.24 | 80 |
| 7P | Mn3O4 | HNO3 | LIQUID | 72 | 0.22-0.27 | EQUAL TO OR LESS THAN 0.01 | 37.0-45.5 |
| 7Q | | POTASSIUM PHTHALATE | LIQUID | 72 | 0.22-0.27 | EQUAL TO OR LESS THAN 0.01 | 37.0-45.5 |
| 7R | | ORTHO-METHYLBENZOIC ACID | LIQUID | 72 | 0.22-0.27 | EQUAL TO OR LESS THAN 0.01 | 37.0-45.5 |
| 7S | | NONE | LIQUID | 72 | EQUAL TO OR LESS THAN 0.01 | 0.09 | 80 |
| 7T | MnO | HNO3 | LIQUID | 72 | 0.22-0.27 | EQUAL TO OR LESS THAN 0.01 | 37.0-45.5 |
| 7U | | POTASSIUM PHTHALATE | LIQUID | 72 | 0.22-0.27 | EQUAL TO OR LESS THAN 0.01 | 37.0-45.5 |
| 7V | | ORTHO-METHYLBENZOIC ACID | LIQUID | 72 | 0.22-0.27 | EQUAL TO OR LESS THAN 0.01 | 37.0-45.5 |
| 7W | | NONE | LIQUID | 72 | EQUAL TO OR LESS THAN 0.01 | 0.11 | 80 |

VCu: POLISHING SPEED FOR Cu, VSiO2: POLISHING SPEED FOR SiO2

FIG. 9

| ABRASIVE | ABRASIVE GRAIN | ADDITIVE | STATE OF ABRASIVE | POLISHING CONDITION | V$_{Al}$ (μm/min) | V$_{SiO2}$ (μm/min) | GRAINS NECESSARY FOR POLISHING BY 1 μm (g) |
|---|---|---|---|---|---|---|---|
| 71 | MnO$_2$ | HNO$_3$ | SOLID | 71 | 0.25-0.50 | EQUAL TO OR LESS THAN 0.02 | 1.6-3.2 |
| 72 | MnO$_2$ | POTASSIUM PHTHALATE | SOLID | 71 | 0.25-0.50 | EQUAL TO OR LESS THAN 0.02 | 1.6-3.2 |
| 73 | MnO$_2$ | ORTHO-METHYLBENZOIC ACID | SOLID | 71 | 0.25-0.50 | EQUAL TO OR LESS THAN 0.02 | 1.6-3.2 |
| 74 | MnO$_2$ | NONE | SOLID | 71 | EQUAL TO OR LESS THAN 0.01 | 0.42 | 80 |
| 75 | Mn$_2$O$_3$ | HNO$_3$ | SOLID | 71 | 0.25-0.50 | EQUAL TO OR LESS THAN 0.02 | 1.6-3.2 |
| 76 | Mn$_2$O$_3$ | POTASSIUM PHTHALATE | SOLID | 71 | 0.25-0.50 | EQUAL TO OR LESS THAN 0.02 | 1.6-3.2 |
| 77 | Mn$_2$O$_3$ | ORTHO-METHYLBENZOIC ACID | SOLID | 71 | 0.25-0.50 | EQUAL TO OR LESS THAN 0.02 | 1.6-3.2 |
| 78 | Mn$_2$O$_3$ | NONE | SOLID | 71 | EQUAL TO OR LESS THAN 0.01 | 0.29 | 80 |
| 79 | Mn$_3$O$_4$ | HNO$_3$ | SOLID | 71 | 0.25-0.50 | EQUAL TO OR LESS THAN 0.02 | 1.6-3.2 |
| 7A | Mn$_3$O$_4$ | POTASSIUM PHTHALATE | SOLID | 71 | 0.25-0.50 | EQUAL TO OR LESS THAN 0.02 | 1.6-3.2 |
| 7B | Mn$_3$O$_4$ | ORTHO-METHYLBENZOIC ACID | SOLID | 71 | 0.25-0.50 | EQUAL TO OR LESS THAN 0.02 | 1.6-3.2 |
| 7C | Mn$_3$O$_4$ | NONE | SOLID | 71 | EQUAL TO OR LESS THAN 0.01 | 0.11 | 80 |
| 7D | MnO | HNO$_3$ | SOLID | 71 | 0.25-0.50 | EQUAL TO OR LESS THAN 0.02 | 1.6-3.2 |
| 7E | MnO | POTASSIUM PHTHALATE | SOLID | 71 | 0.25-0.50 | EQUAL TO OR LESS THAN 0.02 | 1.6-3.2 |
| 7F | MnO | ORTHO-METHYLBENZOIC ACID | SOLID | 71 | 0.25-0.50 | EQUAL TO OR LESS THAN 0.02 | 1.6-3.2 |
| 7G | MnO | NONE | SOLID | 71 | EQUAL TO OR LESS THAN 0.01 | 0.13 | 80 |
| 7H | MnO$_2$ | HNO$_3$ | LIQUID | 72 | 0.14-0.18 | EQUAL TO OR LESS THAN 0.01 | 55.6-71.4 |
| 7I | MnO$_2$ | POTASSIUM PHTHALATE | LIQUID | 72 | 0.14-0.18 | EQUAL TO OR LESS THAN 0.01 | 55.6-71.4 |
| 7J | MnO$_2$ | ORTHO-METHYLBENZOIC ACID | LIQUID | 72 | 0.14-0.18 | EQUAL TO OR LESS THAN 0.01 | 55.6-71.4 |
| 7K | MnO$_2$ | NONE | LIQUID | 72 | EQUAL TO OR LESS THAN 0.01 | 0.35 | 80 |
| 7L | Mn$_2$O$_3$ | HNO$_3$ | LIQUID | 72 | 0.14-0.18 | EQUAL TO OR LESS THAN 0.01 | 55.6-71.4 |
| 7M | Mn$_2$O$_3$ | POTASSIUM PHTHALATE | LIQUID | 72 | 0.14-0.18 | EQUAL TO OR LESS THAN 0.01 | 55.6-71.4 |
| 7N | Mn$_2$O$_3$ | ORTHO-METHYLBENZOIC ACID | LIQUID | 72 | 0.14-0.18 | EQUAL TO OR LESS THAN 0.01 | 55.6-71.4 |
| 7O | Mn$_2$O$_3$ | NONE | LIQUID | 72 | EQUAL TO OR LESS THAN 0.01 | 0.24 | 80 |
| 7P | Mn$_3$O$_4$ | HNO$_3$ | LIQUID | 72 | 0.14-0.18 | EQUAL TO OR LESS THAN 0.01 | 55.6-71.4 |
| 7Q | Mn$_3$O$_4$ | POTASSIUM PHTHALATE | LIQUID | 72 | 0.14-0.18 | EQUAL TO OR LESS THAN 0.01 | 55.6-71.4 |
| 7R | Mn$_3$O$_4$ | ORTHO-METHYLBENZOIC ACID | LIQUID | 72 | 0.14-0.18 | EQUAL TO OR LESS THAN 0.01 | 55.6-71.4 |
| 7S | Mn$_3$O$_4$ | NONE | LIQUID | 72 | EQUAL TO OR LESS THAN 0.01 | 0.09 | 80 |
| 7T | MnO | HNO$_3$ | LIQUID | 72 | 0.14-0.18 | EQUAL TO OR LESS THAN 0.01 | 55.6-71.4 |
| 7U | MnO | POTASSIUM PHTHALATE | LIQUID | 72 | 0.14-0.18 | EQUAL TO OR LESS THAN 0.01 | 55.6-71.4 |
| 7V | MnO | ORTHO-METHYLBENZOIC ACID | LIQUID | 72 | 0.14-0.18 | EQUAL TO OR LESS THAN 0.01 | 55.6-71.4 |
| 7W | MnO | NONE | LIQUID | 72 | EQUAL TO OR LESS THAN 0.01 | 0.11 | 80 |

V$_{Al}$: POLISHING SPEED FOR Al, V$_{SiO2}$: POLISHING SPEED FOR SiO$_2$

FIG.10

| ABRASIVE | ABRASIVE GRAIN | ADDITIVE | STATE OF ABRASIVE | POLISHING CONDITION | Vw (μm/min) | VsiO2 (μm/min) | GRAINS NECESSARY FOR POLISHING BY 1 μm(g) |
|---|---|---|---|---|---|---|---|
| 71 | MnO2 | HNO3 | SOLID | 71 | 0.45-0.70 | EQUAL TO OR LESS THAN 0.02 | 1.14-1.78 |
| 72 | | POTASSIUM PHTHALATE | SOLID | 71 | 0.45-0.70 | EQUAL TO OR LESS THAN 0.02 | 1.14-1.78 |
| 73 | | ORTHO-METHYLBENZOIC ACID | SOLID | 71 | 0.45-0.70 | EQUAL TO OR LESS THAN 0.02 | 1.14-1.78 |
| 74 | | NONE | SOLID | 71 | 0.30-0.55 | 0.42 | 1.45-2.67 |
| 75 | Mn2O3 | HNO3 | SOLID | 71 | 0.45-0.70 | EQUAL TO OR LESS THAN 0.02 | 1.14-1.78 |
| 76 | | POTASSIUM PHTHALATE | SOLID | 71 | 0.45-0.70 | EQUAL TO OR LESS THAN 0.02 | 1.14-1.78 |
| 77 | | ORTHO-METHYLBENZOIC ACID | SOLID | 71 | 0.45-0.70 | EQUAL TO OR LESS THAN 0.02 | 1.14-1.78 |
| 78 | | NONE | SOLID | 71 | 0.30-0.55 | 0.29 | 1.45-2.67 |
| 79 | Mn3O4 | HNO3 | SOLID | 71 | 0.45-0.70 | EQUAL TO OR LESS THAN 0.02 | 1.14-1.78 |
| 7A | | POTASSIUM PHTHALATE | SOLID | 71 | 0.45-0.70 | EQUAL TO OR LESS THAN 0.02 | 1.14-1.78 |
| 7B | | ORTHO-METHYLBENZOIC ACID | SOLID | 71 | 0.45-0.70 | EQUAL TO OR LESS THAN 0.02 | 1.14-1.78 |
| 7C | | NONE | SOLID | 71 | 0.25-0.45 | 0.11 | 1.78-3.20 |
| 7D | MnO | HNO3 | SOLID | 71 | 0.45-0.70 | EQUAL TO OR LESS THAN 0.02 | 1.14-1.78 |
| 7E | | POTASSIUM PHTHALATE | SOLID | 71 | 0.45-0.70 | EQUAL TO OR LESS THAN 0.02 | 1.14-1.78 |
| 7F | | ORTHO-METHYLBENZOIC ACID | SOLID | 71 | 0.45-0.70 | EQUAL TO OR LESS THAN 0.02 | 1.14-1.78 |
| 7G | | NONE | SOLID | 71 | 0.45-0.70 | 0.13 | 1.14-1.78 |
| 7H | MnO2 | HNO3 | LIQUID | 72 | 0.15-0.20 | EQUAL TO OR LESS THAN 0.01 | 50.0-66.7 |
| 7I | | POTASSIUM PHTHALATE | LIQUID | 72 | 0.15-0.20 | EQUAL TO OR LESS THAN 0.01 | 50.0-66.7 |
| 7J | | ORTHO-METHYLBENZOIC ACID | LIQUID | 72 | 0.15-0.20 | EQUAL TO OR LESS THAN 0.01 | 50.0-66.7 |
| 7K | | NONE | LIQUID | 72 | 0.12 | 0.35 | 83.3 |
| 7L | Mn2O3 | HNO3 | LIQUID | 72 | 0.15-0.20 | EQUAL TO OR LESS THAN 0.01 | 50.0-66.7 |
| 7M | | POTASSIUM PHTHALATE | LIQUID | 72 | 0.15-0.20 | EQUAL TO OR LESS THAN 0.01 | 50.0-66.7 |
| 7N | | ORTHO-METHYLBENZOIC ACID | LIQUID | 72 | 0.15-0.20 | EQUAL TO OR LESS THAN 0.01 | 50.0-66.7 |
| 7O | | NONE | LIQUID | 72 | 0.08 | 0.24 | 125 |
| 7P | Mn3O4 | HNO3 | LIQUID | 72 | 0.15-0.20 | EQUAL TO OR LESS THAN 0.01 | 50.0-66.7 |
| 7Q | | POTASSIUM PHTHALATE | LIQUID | 72 | 0.15-0.20 | EQUAL TO OR LESS THAN 0.01 | 50.0-66.7 |
| 7R | | ORTHO-METHYLBENZOIC ACID | LIQUID | 72 | 0.15-0.20 | EQUAL TO OR LESS THAN 0.01 | 50.0-66.7 |
| 7S | | NONE | LIQUID | 72 | 0.04 | 0.09 | 250 |
| 7T | MnO | HNO3 | LIQUID | 72 | 0.15-0.20 | EQUAL TO OR LESS THAN 0.01 | 50.0-66.7 |
| 7U | | POTASSIUM PHTHALATE | LIQUID | 72 | 0.15-0.20 | EQUAL TO OR LESS THAN 0.01 | 50.0-66.7 |
| 7V | | ORTHO-METHYLBENZOIC ACID | LIQUID | 72 | 0.15-0.20 | EQUAL TO OR LESS THAN 0.01 | 50.0-66.7 |
| 7W | | NONE | LIQUID | 72 | 0.2 | 0.11 | 50 |

Vw: POLISHING SPEED FOR W, VsiO2: POLISHING SPEED FOR SiO2

FIG.11

| ABRASIVE | ABRASIVE GRAIN | POLISHING CONDITION | SUPPLIED ADDITIVE | $V_{Cu}$ ($\mu$m/min) | $V_{SiO2}$ ($\mu$m/min) | GRAINS NECESSARY FOR POLISHING BY 1 $\mu$m(g) |
|---|---|---|---|---|---|---|
| 81 | MnO2 | 81 | H2O | EQUAL TO OR LESS THAN 0.01 | 0.13 | 80 |
| | | 82 | HNO3 | 0.30-0.55 | EQUAL TO OR LESS THAN 0.02 | 1.45-2.67 |
| | | 83 | POTASSIUM PHTHALATE | 0.30-0.55 | EQUAL TO OR LESS THAN 0.02 | 1.45-2.67 |
| | | 84 | ORTHO-METHYLBENZOIC ACID | 0.30-0.55 | EQUAL TO OR LESS THAN 0.02 | 1.45-2.67 |
| 82 | Mn2O3 | 81 | H2O | EQUAL TO OR LESS THAN 0.01 | 0.42 | 80 |
| | | 82 | HNO3 | 0.30-0.55 | EQUAL TO OR LESS THAN 0.02 | 1.45-2.67 |
| | | 83 | POTASSIUM PHTHALATE | 0.30-0.55 | EQUAL TO OR LESS THAN 0.02 | 1.45-2.67 |
| | | 84 | ORTHO-METHYLBENZOIC ACID | 0.30-0.55 | EQUAL TO OR LESS THAN 0.02 | 1.45-2.67 |
| 83 | Mn3O4 | 81 | H2O | EQUAL TO OR LESS THAN 0.01 | 0.29 | 80 |
| | | 82 | HNO3 | 0.30-0.55 | EQUAL TO OR LESS THAN 0.02 | 1.45-2.67 |
| | | 83 | POTASSIUM PHTHALATE | 0.30-0.55 | EQUAL TO OR LESS THAN 0.02 | 1.45-2.67 |
| | | 84 | ORTHO-METHYLBENZOIC ACID | 0.30-0.55 | EQUAL TO OR LESS THAN 0.02 | 1.45-2.67 |
| 84 | MnO | 81 | H2O | EQUAL TO OR LESS THAN 0.01 | 0.11 | 80 |
| | | 82 | HNO3 | 0.30-0.55 | EQUAL TO OR LESS THAN 0.02 | 1.45-2.67 |
| | | 83 | POTASSIUM PHTHALATE | 0.30-0.55 | EQUAL TO OR LESS THAN 0.02 | 1.45-2.67 |
| | | 84 | ORTHO-METHYLBENZOIC ACID | 0.30-0.55 | EQUAL TO OR LESS THAN 0.02 | 1.45-2.67 |

$V_{Cu}$: POLISHING SPEED FOR Cu
$V_{SiO2}$: POLISHING SPEED FOR SiO2

FIG.12

| ABRASIVE | ABRASIVE GRAIN | POLISHING CONDITION | SUPPLIED ADDITIVE | $V_{Al}$ ($\mu$m/min) | $V_{SiO_2}$ ($\mu$m/min) | GRAINS NECESSARY FOR POLISHING BY 1 $\mu$m (g) |
|---|---|---|---|---|---|---|
| 81 | MnO2 | 81 | H2O | EQUAL TO OR LESS THAN 0.01 | 0.13 | 80 |
| | | 82 | HNO3 | 0.25-0.50 | EQUAL TO OR LESS THAN 0.02 | 1.6-3.2 |
| | | 83 | POTASSIUM PHTHALATE | 0.25-0.50 | EQUAL TO OR LESS THAN 0.02 | 1.6-3.2 |
| | | 84 | ORTHO-METHYLBENZOIC ACID | 0.25-0.50 | EQUAL TO OR LESS THAN 0.02 | 1.6-3.2 |
| 82 | Mn2O3 | 81 | H2O | EQUAL TO OR LESS THAN 0.01 | 0.42 | 80 |
| | | 82 | HNO3 | 0.25-0.50 | EQUAL TO OR LESS THAN 0.02 | 1.6-3.2 |
| | | 83 | POTASSIUM PHTHALATE | 0.25-0.50 | EQUAL TO OR LESS THAN 0.02 | 1.6-3.2 |
| | | 84 | ORTHO-METHYLBENZOIC ACID | 0.25-0.50 | EQUAL TO OR LESS THAN 0.02 | 1.6-3.2 |
| 83 | Mn3O4 | 81 | H2O | EQUAL TO OR LESS THAN 0.01 | 0.29 | 80 |
| | | 82 | HNO3 | 0.25-0.50 | EQUAL TO OR LESS THAN 0.02 | 1.6-3.2 |
| | | 83 | POTASSIUM PHTHALATE | 0.25-0.50 | EQUAL TO OR LESS THAN 0.02 | 1.6-3.2 |
| | | 84 | ORTHO-METHYLBENZOIC ACID | 0.25-0.50 | EQUAL TO OR LESS THAN 0.02 | 1.6-3.2 |
| 84 | MnO | 81 | H2O | EQUAL TO OR LESS THAN 0.01 | 0.11 | 80 |
| | | 82 | HNO3 | 0.25-0.50 | EQUAL TO OR LESS THAN 0.02 | 1.6-3.2 |
| | | 83 | POTASSIUM PHTHALATE | 0.25-0.50 | EQUAL TO OR LESS THAN 0.02 | 1.6-3.2 |
| | | 84 | ORTHO-METHYLBENZOIC ACID | 0.25-0.50 | EQUAL TO OR LESS THAN 0.02 | 1.6-3.2 |

$V_{Al}$: POLISHING SPEED FOR Al
$V_{SiO_2}$: POLISHING SPEED FOR SiO2

FIG.13

| ABRASIVE | ABRASIVE GRAIN | POLISHING CONDITION | SUPPLIED ADDITIVE | Vw (μm/min) | VsiO2 (μm/min) | GRAINS NECESSARY FOR POLISHING BY 1 μm(g) |
|---|---|---|---|---|---|---|
| 81 | MnO2 | 81 | H2O | 0.45-0.70 | 0.13 | 1.14-1.78 |
| | | 82 | HNO3 | 0.45-0.70 | EQUAL TO OR LESS THAN 0.02 | 1.14-1.78 |
| | | 83 | POTASSIUM PHTHALATE | 0.45-0.70 | EQUAL TO OR LESS THAN 0.02 | 1.14-1.78 |
| | | 84 | ORTHO-METHYLBENZOIC ACID | 0.45-0.70 | EQUAL TO OR LESS THAN 0.02 | 1.14-1.78 |
| 82 | Mn2O3 | 81 | H2O | 0.30-0.55 | 0.42 | 1.45-2.67 |
| | | 82 | HNO3 | 0.45-0.70 | EQUAL TO OR LESS THAN 0.02 | 1.14-1.78 |
| | | 83 | POTASSIUM PHTHALATE | 0.45-0.70 | EQUAL TO OR LESS THAN 0.02 | 1.14-1.78 |
| | | 84 | ORTHO-METHYLBENZOIC ACID | 0.45-0.70 | EQUAL TO OR LESS THAN 0.02 | 1.14-1.78 |
| 83 | Mn3O4 | 81 | H2O | 0.30-0.55 | 0.29 | 1.45-2.67 |
| | | 82 | HNO3 | 0.45-0.70 | EQUAL TO OR LESS THAN 0.02 | 1.14-1.78 |
| | | 83 | POTASSIUM PHTHALATE | 0.45-0.70 | EQUAL TO OR LESS THAN 0.02 | 1.14-1.78 |
| | | 84 | ORTHO-METHYLBENZOIC ACID | 0.45-0.70 | EQUAL TO OR LESS THAN 0.02 | 1.14-1.78 |
| 84 | MnO | 81 | H2O | 0.25-0.45 | 0.11 | 1.78-3.20 |
| | | 82 | HNO3 | 0.45-0.70 | EQUAL TO OR LESS THAN 0.02 | 1.14-1.78 |
| | | 83 | POTASSIUM PHTHALATE | 0.45-0.70 | EQUAL TO OR LESS THAN 0.02 | 1.14-1.78 |
| | | 84 | ORTHO-METHYLBENZOIC ACID | 0.45-0.70 | EQUAL TO OR LESS THAN 0.02 | 1.14-1.78 |

Vw:POLISHING SPEED FOR W
VsiO2:POLISHING SPEED FOR SiO2

FIG.14

| ABRASIVE | POLISHING CONDITION | WORK | | | | | | | | | | | | | | | | | | |
|---|---|---|---|---|---|---|---|---|---|---|---|---|---|---|---|---|---|---|---|
| | | 101 Ti | 102 TiN | 103 Cr | 104 Co | 105 Fe | 106 Ni | 107 Nb | 108 Mo | 109 MoO | 10A Mo2N | 10B Ru | 10C RuO | 10D Pd | 10E Hf | 10F Ta | 10G TaN | 10H WN | 10I Ti | 10J IrO |
| SAMPLE 101 | 101 | × | × | × | × | × | × | ○ | ○ | ○ | ○ | × | × | ○ | ○ | ○ | × | × | × | ○ |
| | 102 | ○ | ○ | ○ | ○ | ○ | × | ○ | ○ | ○ | ○ | ○ | ○ | ○ | × | ○ | ○ | ○ | × | ○ |
| | 103 | ○ | ○ | × | × | × | × | ○ | ○ | ○ | ○ | ○ | ○ | ○ | × | ○ | ○ | ○ | × | ○ |
| | 104 | ○ | ○ | × | × | × | × | ○ | ○ | ○ | ○ | ○ | ○ | ○ | × | ○ | ○ | ○ | ○ | ○ |
| | 105 | ○ | ○ | × | × | ○ | × | ○ | ○ | ○ | ○ | ○ | ○ | ○ | ○ | ○ | ○ | ○ | × | ○ |
| | 106 | ○ | ○ | × | × | × | × | ○ | ○ | ○ | ○ | ○ | ○ | ○ | × | ○ | ○ | ○ | × | ○ |
| | 107 | ○ | ○ | × | ○ | ○ | × | ○ | ○ | ○ | ○ | ○ | ○ | ○ | ○ | ○ | ○ | ○ | ○ | ○ |
| | 108 | ○ | ○ | ○ | ○ | ○ | × | ○ | ○ | ○ | ○ | ○ | ○ | ○ | ○ | ○ | ○ | ○ | × | ○ |
| | 109 | ○ | ○ | ○ | ○ | ○ | ○ | ○ | ○ | ○ | ○ | ○ | ○ | ○ | × | ○ | ○ | ○ | ○ | ○ |
| SAMPLE 102 | 101 | × | × | × | × | × | × | ○ | ○ | ○ | ○ | × | × | ○ | × | ○ | × | × | × | ○ |
| | 102 | ○ | ○ | ○ | ○ | ○ | × | ○ | ○ | ○ | ○ | ○ | ○ | ○ | ○ | ○ | ○ | ○ | × | ○ |
| | 103 | ○ | ○ | × | × | × | × | ○ | ○ | ○ | ○ | ○ | ○ | ○ | × | ○ | ○ | ○ | × | ○ |
| | 104 | ○ | ○ | × | × | × | × | ○ | ○ | ○ | ○ | ○ | ○ | ○ | × | ○ | ○ | ○ | ○ | ○ |
| | 105 | ○ | ○ | × | × | ○ | × | ○ | ○ | ○ | ○ | ○ | ○ | ○ | ○ | ○ | ○ | ○ | × | ○ |
| | 106 | ○ | ○ | × | × | × | × | ○ | ○ | ○ | ○ | ○ | ○ | ○ | × | ○ | ○ | ○ | × | ○ |
| | 107 | ○ | ○ | × | ○ | ○ | × | ○ | ○ | ○ | ○ | ○ | ○ | ○ | ○ | ○ | ○ | ○ | ○ | ○ |
| | 108 | ○ | ○ | ○ | ○ | ○ | × | ○ | ○ | ○ | ○ | ○ | ○ | ○ | ○ | ○ | ○ | ○ | × | ○ |
| | 109 | ○ | ○ | ○ | ○ | ○ | ○ | ○ | ○ | ○ | ○ | ○ | ○ | ○ | × | ○ | ○ | ○ | ○ | ○ |
| SAMPLE 103 | 101 | × | × | × | × | × | × | ○ | ○ | ○ | ○ | × | × | ○ | × | ○ | × | × | × | ○ |
| | 102 | ○ | ○ | ○ | ○ | ○ | × | ○ | ○ | ○ | ○ | ○ | ○ | ○ | ○ | ○ | ○ | ○ | × | ○ |
| | 103 | ○ | ○ | × | × | × | × | ○ | ○ | ○ | ○ | ○ | ○ | ○ | × | ○ | ○ | ○ | × | ○ |
| | 104 | ○ | ○ | × | × | × | × | ○ | ○ | ○ | ○ | ○ | ○ | ○ | × | ○ | ○ | ○ | ○ | ○ |
| | 105 | ○ | ○ | × | × | ○ | × | ○ | ○ | ○ | ○ | ○ | ○ | ○ | ○ | ○ | ○ | ○ | × | ○ |
| | 106 | ○ | ○ | × | × | × | × | ○ | ○ | ○ | ○ | ○ | ○ | ○ | × | ○ | ○ | ○ | × | ○ |
| | 107 | ○ | ○ | × | ○ | ○ | × | ○ | ○ | ○ | ○ | ○ | ○ | ○ | ○ | ○ | ○ | ○ | ○ | ○ |
| | 108 | ○ | ○ | ○ | ○ | ○ | × | ○ | ○ | ○ | ○ | ○ | ○ | ○ | ○ | ○ | ○ | ○ | × | ○ |
| | 109 | ○ | ○ | ○ | ○ | ○ | ○ | ○ | ○ | ○ | ○ | ○ | ○ | ○ | × | ○ | ○ | ○ | ○ | ○ |
| SAMPLE 104 | 101 | × | × | × | × | × | × | ○ | ○ | ○ | ○ | × | × | ○ | × | ○ | × | × | × | ○ |
| | 102 | ○ | ○ | ○ | ○ | ○ | × | ○ | ○ | ○ | ○ | ○ | ○ | ○ | ○ | ○ | ○ | ○ | × | ○ |
| | 103 | ○ | ○ | × | × | × | × | ○ | ○ | ○ | ○ | ○ | ○ | ○ | × | ○ | ○ | ○ | × | ○ |
| | 104 | ○ | ○ | × | × | × | × | ○ | ○ | ○ | ○ | ○ | ○ | ○ | × | ○ | ○ | ○ | ○ | ○ |
| | 105 | ○ | ○ | × | × | ○ | × | ○ | ○ | ○ | ○ | ○ | ○ | ○ | ○ | ○ | ○ | ○ | × | ○ |
| | 106 | ○ | ○ | × | × | × | × | ○ | ○ | ○ | ○ | ○ | ○ | ○ | × | ○ | ○ | ○ | × | ○ |
| | 107 | ○ | ○ | ○ | ○ | ○ | × | ○ | ○ | ○ | ○ | ○ | ○ | ○ | ○ | ○ | ○ | ○ | ○ | ○ |
| | 108 | ○ | ○ | ○ | ○ | ○ | × | ○ | ○ | ○ | ○ | ○ | ○ | ○ | ○ | ○ | ○ | ○ | × | ○ |
| | 109 | ○ | ○ | ○ | ○ | ○ | ○ | ○ | ○ | ○ | ○ | ○ | ○ | ○ | ○ | ○ | ○ | ○ | ○ | ○ |

○···POLISHABLE, ×···UNPOLISHABLE

FIG.15

| ABRASIVE | ABRASIVE GRAIN | WASHING CONDITION | ATOMIC DENSITY OF RESIDUAL Mn (atoms/m²) | AMOUNT OF CORROSION (nm) |
|---|---|---|---|---|
| 121 | MnO₂ | 11 | EQUAL TO OR LESS THAN 3×10¹¹ | EQUAL TO OR LESS THAN 10 |
| | | 12 | EQUAL TO OR LESS THAN 3×10¹¹ | EQUAL TO OR LESS THAN 10 |
| | | 13 | EQUAL TO OR LESS THAN 3×10¹¹ | EQUAL TO OR LESS THAN 10 |
| | | 14 | EQUAL TO OR LESS THAN 3×10¹¹ | EQUAL TO OR LESS THAN 10 |
| | | 15 | EQUAL TO OR LESS THAN 3×10¹¹ | 30 |
| | | 16 | EQUAL TO OR LESS THAN 3×10¹¹ | EQUAL TO OR LESS THAN 10 |
| | | 17 | EQUAL TO OR MORE THAN 5×10¹³ | EQUAL TO OR LESS THAN 10 |
| | | 18 | EQUAL TO OR LESS THAN 3×10¹¹ | EQUAL TO OR MORE THAN 50 |
| 122 | Mn₂O₃ | 11 | EQUAL TO OR LESS THAN 3×10¹¹ | EQUAL TO OR LESS THAN 10 |
| | | 12 | EQUAL TO OR LESS THAN 3×10¹¹ | EQUAL TO OR LESS THAN 10 |
| | | 13 | EQUAL TO OR LESS THAN 3×10¹¹ | EQUAL TO OR LESS THAN 10 |
| | | 14 | EQUAL TO OR LESS THAN 3×10¹¹ | EQUAL TO OR LESS THAN 10 |
| | | 15 | EQUAL TO OR LESS THAN 3×10¹¹ | 30 |
| | | 16 | EQUAL TO OR LESS THAN 3×10¹¹ | EQUAL TO OR LESS THAN 10 |
| | | 17 | EQUAL TO OR MORE THAN 5×10¹⁴ | EQUAL TO OR LESS THAN 10 |
| | | 18 | EQUAL TO OR LESS THAN 3×10¹¹ | EQUAL TO OR MORE THAN 50 |
| 123 | Mn₃O₄ | 11 | EQUAL TO OR LESS THAN 3×10¹¹ | EQUAL TO OR LESS THAN 10 |
| | | 12 | EQUAL TO OR LESS THAN 3×10¹¹ | EQUAL TO OR LESS THAN 10 |
| | | 13 | EQUAL TO OR LESS THAN 3×10¹¹ | EQUAL TO OR LESS THAN 10 |
| | | 14 | EQUAL TO OR LESS THAN 3×10¹¹ | EQUAL TO OR LESS THAN 10 |
| | | 15 | EQUAL TO OR LESS THAN 3×10¹¹ | 30 |
| | | 16 | EQUAL TO OR LESS THAN 3×10¹¹ | EQUAL TO OR LESS THAN 10 |
| | | 17 | EQUAL TO OR MORE THAN 5×10¹³ | EQUAL TO OR LESS THAN 10 |
| | | 18 | EQUAL TO OR LESS THAN 3×10¹¹ | EQUAL TO OR MORE THAN 50 |
| 124 | MnO | 11 | EQUAL TO OR LESS THAN 3×10¹¹ | EQUAL TO OR LESS THAN 10 |
| | | 12 | EQUAL TO OR LESS THAN 3×10¹¹ | EQUAL TO OR LESS THAN 10 |
| | | 13 | EQUAL TO OR LESS THAN 3×10¹¹ | EQUAL TO OR LESS THAN 10 |
| | | 14 | EQUAL TO OR LESS THAN 3×10¹¹ | EQUAL TO OR LESS THAN 10 |
| | | 15 | EQUAL TO OR LESS THAN 3×10¹¹ | 30 |
| | | 16 | EQUAL TO OR LESS THAN 3×10¹¹ | EQUAL TO OR LESS THAN 10 |
| | | 17 | EQUAL TO OR MORE THAN 5×10¹³ | EQUAL TO OR LESS THAN 10 |
| | | 18 | EQUAL TO OR LESS THAN 3×10¹¹ | EQUAL TO OR MORE THAN 50 |

FIG.16

| ABRASIVE | ABRASIVE GRAIN | WASHING CONDITION | ATOMIC DENSITY OF RESIDUAL Mn (atoms/m²) | AMOUNT OF CORROSION (nm) |
|---|---|---|---|---|
| 121 | MnO₂ | 11 | EQUAL TO OR LESS THAN 3×10¹¹ | EQUAL TO OR LESS THAN 10 |
| | | 12 | EQUAL TO OR LESS THAN 3×10¹¹ | EQUAL TO OR LESS THAN 10 |
| | | 13 | EQUAL TO OR LESS THAN 3×10¹¹ | EQUAL TO OR LESS THAN 10 |
| | | 14 | EQUAL TO OR LESS THAN 3×10¹¹ | EQUAL TO OR LESS THAN 10 |
| | | 15 | EQUAL TO OR LESS THAN 3×10¹¹ | 30 |
| | | 16 | EQUAL TO OR LESS THAN 3×10¹¹ | EQUAL TO OR LESS THAN 10 |
| | | 17 | EQUAL TO OR MORE THAN 5×10¹³ | EQUAL TO OR MORE THAN 50 |
| | | 18 | EQUAL TO OR LESS THAN 3×10¹¹ | EQUAL TO OR LESS THAN 10 |
| 122 | Mn₂O₃ | 11 | EQUAL TO OR LESS THAN 3×10¹¹ | EQUAL TO OR LESS THAN 10 |
| | | 12 | EQUAL TO OR LESS THAN 3×10¹¹ | EQUAL TO OR LESS THAN 10 |
| | | 13 | EQUAL TO OR LESS THAN 3×10¹¹ | EQUAL TO OR LESS THAN 10 |
| | | 14 | EQUAL TO OR LESS THAN 3×10¹¹ | EQUAL TO OR LESS THAN 10 |
| | | 15 | EQUAL TO OR LESS THAN 3×10¹¹ | 30 |
| | | 16 | EQUAL TO OR LESS THAN 3×10¹¹ | EQUAL TO OR LESS THAN 10 |
| | | 17 | EQUAL TO OR MORE THAN 5×10¹³ | EQUAL TO OR MORE THAN 50 |
| | | 18 | EQUAL TO OR LESS THAN 3×10¹¹ | EQUAL TO OR LESS THAN 10 |
| 123 | Mn₃O₄ | 11 | EQUAL TO OR LESS THAN 3×10¹¹ | EQUAL TO OR LESS THAN 10 |
| | | 12 | EQUAL TO OR LESS THAN 3×10¹¹ | EQUAL TO OR LESS THAN 10 |
| | | 13 | EQUAL TO OR LESS THAN 3×10¹¹ | EQUAL TO OR LESS THAN 10 |
| | | 14 | EQUAL TO OR LESS THAN 3×10¹¹ | EQUAL TO OR LESS THAN 10 |
| | | 15 | EQUAL TO OR LESS THAN 3×10¹¹ | 30 |
| | | 16 | EQUAL TO OR LESS THAN 3×10¹¹ | EQUAL TO OR LESS THAN 10 |
| | | 17 | EQUAL TO OR MORE THAN 5×10¹³ | EQUAL TO OR MORE THAN 50 |
| | | 18 | EQUAL TO OR LESS THAN 3×10¹¹ | EQUAL TO OR LESS THAN 10 |
| 124 | MnO | 11 | EQUAL TO OR LESS THAN 3×10¹¹ | EQUAL TO OR LESS THAN 10 |
| | | 12 | EQUAL TO OR LESS THAN 3×10¹¹ | EQUAL TO OR LESS THAN 10 |
| | | 13 | EQUAL TO OR LESS THAN 3×10¹¹ | EQUAL TO OR LESS THAN 10 |
| | | 14 | EQUAL TO OR LESS THAN 3×10¹¹ | EQUAL TO OR LESS THAN 10 |
| | | 15 | EQUAL TO OR LESS THAN 3×10¹¹ | 30 |
| | | 16 | EQUAL TO OR LESS THAN 3×10¹¹ | EQUAL TO OR LESS THAN 10 |
| | | 17 | EQUAL TO OR MORE THAN 5×10¹³ | EQUAL TO OR MORE THAN 50 |
| | | 18 | EQUAL TO OR LESS THAN 3×10¹¹ | EQUAL TO OR LESS THAN 10 |

FIG.17

| ABRASIVE | ABRASIVE GRAIN | WASHING CONDITION | ATOMIC DENSITY OF RESIDUAL Mn (atoms/m²) |
|---|---|---|---|
| 121 | $MnO_2$ | 21 | EQUAL TO OR LESS THAN $1.5 \times 10^{11}$ |
| | | 22 | EQUAL TO OR LESS THAN $1.5 \times 10^{11}$ |
| | | 23 | EQUAL TO OR LESS THAN $1.5 \times 10^{11}$ |
| | | 24 | EQUAL TO OR LESS THAN $1.5 \times 10^{11}$ |
| | | 25 | EQUAL TO OR LESS THAN $1.5 \times 10^{11}$ |
| | | 26 | EQUAL TO OR LESS THAN $1.5 \times 10^{11}$ |
| | | 27 | EQUAL TO OR MORE THAN $5 \times 10^{13}$ |
| 122 | $Mn_2O_3$ | 21 | EQUAL TO OR LESS THAN $1.5 \times 10^{11}$ |
| | | 22 | EQUAL TO OR LESS THAN $1.5 \times 10^{11}$ |
| | | 23 | EQUAL TO OR LESS THAN $1.5 \times 10^{11}$ |
| | | 24 | EQUAL TO OR LESS THAN $1.5 \times 10^{11}$ |
| | | 25 | EQUAL TO OR LESS THAN $1.5 \times 10^{11}$ |
| | | 26 | EQUAL TO OR LESS THAN $1.5 \times 10^{11}$ |
| | | 27 | EQUAL TO OR MORE THAN $5 \times 10^{13}$ |
| 123 | $Mn_3O_4$ | 21 | EQUAL TO OR LESS THAN $1.5 \times 10^{11}$ |
| | | 22 | EQUAL TO OR LESS THAN $1.5 \times 10^{11}$ |
| | | 23 | EQUAL TO OR LESS THAN $1.5 \times 10^{11}$ |
| | | 24 | EQUAL TO OR LESS THAN $1.5 \times 10^{11}$ |
| | | 25 | EQUAL TO OR LESS THAN $1.5 \times 10^{11}$ |
| | | 26 | EQUAL TO OR LESS THAN $1.5 \times 10^{11}$ |
| | | 27 | EQUAL TO OR MORE THAN $5 \times 10^{13}$ |
| 124 | $MnO$ | 21 | EQUAL TO OR LESS THAN $1.5 \times 10^{11}$ |
| | | 22 | EQUAL TO OR LESS THAN $1.5 \times 10^{11}$ |
| | | 23 | EQUAL TO OR LESS THAN $1.5 \times 10^{11}$ |
| | | 24 | EQUAL TO OR LESS THAN $1.5 \times 10^{11}$ |
| | | 25 | EQUAL TO OR LESS THAN $1.5 \times 10^{11}$ |
| | | 26 | EQUAL TO OR LESS THAN $1.5 \times 10^{11}$ |
| | | 27 | EQUAL TO OR MORE THAN $5 \times 10^{13}$ |

FIG.18

| ABRASIVE | ABRASIVE GRAIN | WASHING CONDITION | ATOMIC DENSITY OF RESIDUAL Mn (atoms/m$^2$) |
|---|---|---|---|
| 121 | MnO$_2$ | 21 | EQUAL TO OR LESS THAN 1.5x10$^{11}$ |
| | | 22 | EQUAL TO OR LESS THAN 1.5x10$^{11}$ |
| | | 23 | EQUAL TO OR LESS THAN 1.5x10$^{11}$ |
| | | 24 | EQUAL TO OR LESS THAN 1.5x10$^{11}$ |
| | | 25 | EQUAL TO OR LESS THAN 1.5x10$^{11}$ |
| | | 26 | EQUAL TO OR LESS THAN 1.5x10$^{11}$ |
| | | 27 | EQUAL TO OR MORE THAN 5x10$^{13}$ |
| 122 | Mn$_2$O$_3$ | 21 | EQUAL TO OR LESS THAN 1.5x10$^{11}$ |
| | | 22 | EQUAL TO OR LESS THAN 1.5x10$^{11}$ |
| | | 23 | EQUAL TO OR LESS THAN 1.5x10$^{11}$ |
| | | 24 | EQUAL TO OR LESS THAN 1.5x10$^{11}$ |
| | | 25 | EQUAL TO OR LESS THAN 1.5x10$^{11}$ |
| | | 26 | EQUAL TO OR LESS THAN 1.5x10$^{11}$ |
| | | 27 | EQUAL TO OR MORE THAN 5x10$^{13}$ |
| 123 | Mn$_3$O$_4$ | 21 | EQUAL TO OR LESS THAN 1.5x10$^{11}$ |
| | | 22 | EQUAL TO OR LESS THAN 1.5x10$^{11}$ |
| | | 23 | EQUAL TO OR LESS THAN 1.5x10$^{11}$ |
| | | 24 | EQUAL TO OR LESS THAN 1.5x10$^{11}$ |
| | | 25 | EQUAL TO OR LESS THAN 1.5x10$^{11}$ |
| | | 26 | EQUAL TO OR LESS THAN 1.5x10$^{11}$ |
| | | 27 | EQUAL TO OR MORE THAN 5x10$^{13}$ |
| 124 | MnO | 21 | EQUAL TO OR LESS THAN 1.5x10$^{11}$ |
| | | 22 | EQUAL TO OR LESS THAN 1.5x10$^{11}$ |
| | | 23 | EQUAL TO OR LESS THAN 1.5x10$^{11}$ |
| | | 24 | EQUAL TO OR LESS THAN 1.5x10$^{11}$ |
| | | 25 | EQUAL TO OR LESS THAN 1.5x10$^{11}$ |
| | | 26 | EQUAL TO OR LESS THAN 1.5x10$^{11}$ |
| | | 27 | EQUAL TO OR MORE THAN 5x10$^{13}$ |

METHOD OF WASHING A POLISHED OBJECT

This application is a divisional of U.S. patent application Ser. No. 10/440,299 filed May 19, 2003, now abandoned the entire contents of which is hereby incorporated by reference.

CROSS-REFERENCE TO RELATED APPLICATIONS

The present application is based on Japanese priority application No.2002-146126 filed on May 21, 2002, the entire contents of which are hereby incorporated by reference.

BACKGROUND OF THE INVENTION

1. Field of the Invention

The present invention generally relates to an abrasive and a polishing method, and in particular, relates to an abrasive and a polishing method that are used in a chemical mechanical polishing (CMP) process in a fabrication process for a semiconductor device.

2. Description of the Related Art

In a semiconductor device and a thin-film magnetic head, etc., a multi-layer structure provided by laminating films that are made be thinner by rolling has been employed. In particular, a multi-layer wiring structure has been employed in a semiconductor integrated circuit, in which wiring structures obtained by embedding a wiring pattern into an interlayer insulation layer formed on a substrate are laminated to be a multi-layer. In recent years, much more lamination and integration have been required with miniaturization of semiconductor integrated circuits.

Accordingly, when the multi-layer wiring structure is formed, a contact hole or a wiring slot is conventionally formed on the interlayer insulation layer and a metal layer is deposited on such an interlayer insulation layer so that the contact hole or the wiring slot is embedded. Then, such a metal layer is eliminated by means of polishing until the surface of the interlayer insulation layer is exposed, so that a flat wiring structure is formed. Since the upper principal surface of such a wiring structure is flat, a next wiring structure is easily formed thereon.

Speeding up as well as integration and miniaturization of semiconductor integrated circuits has been required. As the width of wiring is narrowed or the space of wiring is miniaturized for improving the integration, both wiring resistance (R) and wiring capacitance (C) are increased. Then, since the transmission time of a signal passing through the wiring is proportional to the product of R and C, RC delay occurs. While the length of the wire is shortened and the throughput speed of a semiconductor device is thus improved, the RC delay has become problematic in the total circuit delay of the semiconductor integrated circuit.

For improving the RC delay, the development of a dual damascene process using Cu (Cu dual damascene process) for a wiring material has been advanced in order to reduce the wiring resistance. In the dual damascene process, a slot for wiring and a contact hole for interlayer conduction are formed integrally in the interlayer insulation layer. The metal layer is deposited so that the slot and the contact hole are embedded with the wiring material. The metal layer is eliminated by means of polishing until the interlayer insulation layer is exposed, so that a flat wiring structure is formed. Additionally, in order to reduce the wiring capacitance, conventionally, $SiO_2$ is used for the interlayer insulation layer and an organic thermosetting resin with a low-dielectric constant (low-k) has been examined.

In the polishing process, both the polishing and the elimination of the metal layer used for wiring, etc., are performed in a CMP (chemical mechanical polishing) method.

In Japanese Laid-Open Patent Application No. 2000-091284, the inventors of the present invention disclose that an abrasive including abrasive grains of $MnO_2$ and an additive that contains $NO_3^-$ has a selectivity such that W, Cu, and TiN, etc., as wiring materials can be polished with little polishing of $SiO_2$ as the interlayer insulation layer in the semiconductor device. In such a polishing process, a process for adjusting the surface of a polishing cloth by using a dress jig is employed in order to improve the flatness of an object to be processed. In the dress jig, a fixed grindstone is used in which abrasive grains such as diamond, etc. are fixed with resin or epoxy. The inventors of the present invention found that the problem occurs that $MnO_2$ as abrasive grains to polish the semiconductor device dissolves the resin or epoxy, and the abrasive grains of diamond, etc., detached from the fixed grindstone, are mixed with the abrasive on the surface of the polishing cloth, so as to damage the object to be processed.

The inventors also found that a problem occurs that since manganese oxides such as MnO, $MnO_2$, $Mn_2O_3$ and $Mn_3O_4$ have oxidative effect, when an additive for eliminating oxides formed on the surface of an object to be processed is not contained in the abrasive, a metal or an intermetallic compound thereof as an object to be processed is oxidized during the polishing and an oxide layer is formed on the surface of the object to be processed, so that the object to be processed cannot be polished.

On the other hand, the materials used for the semiconductor device have been gradually diversified. For the wiring, W, Al, Cu, TiN, Ti, WN, Ta, TaN, etc., are used. Additionally, as a gate electrode, a metal or metal compound electrode could be realized from the requirement to lower the resistance of the electrode. In dual gate CMOS-type semiconductor devices, selected are different materials for gate electrodes suitable for P-channel MOS-type semiconductor devices and N-channel MOS-type semiconductor devices, respectively. FIG. 1 is a diagram showing examples of the materials for the gate electrodes. It is considered that a material having a work function close to a work function (an ideal value) suitable for the respective semiconductor device should be selected. Then, in the fabrication process, the gate electrode or wiring in which the above-mentioned metals are used is polished by a CMP method in the fabrication process of the semiconductor device. Accordingly, the problem occurs that abrasive grains suitable for the respective metals are used in the polishing process and various kinds of abrasive grain components are contained in the waste produced in the process, so that it becomes difficult to treat, recover and recycle the waste.

Additionally, in the polishing process, silica ($SiO_2$), ceria ($CeO_2$), alumina ($Al_2O_3$), zirconia ($ZrO_2$), a manganese oxide, diamond, etc., mainstream in the CMP method at present, are employed as free abrasive grains and the amount of abrasive grains that contributes to the polishing effectively is equal to or less than 5% of feed. Also, since abrasive grains that do not contribute to the polishing are wasted without being recycled, the amount of the waste becomes too much and a problem from the viewpoint of effective use of resources occurs. However, from the viewpoint of efficient use of the abrasive grains, techniques for a fixed grindstone in which abrasive grains of manganese oxide are fixed with a binder are disclosed in Japanese Laid-Open Patent Application No. 11-207632, Japanese Laid-Open Patent Application No. 2000-6031, and Japanese Laid-Open Patent Application No. 2001-9731. Such a fixed grindstone has the effect that almost all the abrasive grains contribute to the polishing so as to reduce the amount of the waste. However, it is cumbersome and complicated to adjust the condition of the polishing because of a lack of uniformity in the abrasive grains embedded in the fixed grindstone, variation with time in regard to the ability of the polishing, and the dispersion of the polishing property among the individual fixed grindstones, etc. Thus, the production efficiency is lowered and polishing with a fixed grindstone has not yet become a technique to replace to polishing with free abrasive grains.

Furthermore, in Japanese Laid-Open Patent Application No. 9-22888, the inventors disclose that after polishing by using the abrasive grains of $MnO_2$, the semiconductor device is washed by using an inorganic acid such as HCl, $HNO_3$, $H_2SO_4$, HF, etc., and $H_2O_2$ so as to effectively eliminate $MnO_2$ remaining in the semiconductor device. However, in a part of the washing condition, the problem occurs that wiring of Cu or Al embedded in the semiconductor device is corroded by the washing.

SUMMARY OF THE INVENTION

It is an object of the present invention to provide an abrasive having selectivity for polishing an object to be processed and being capable of preventing the object from being damaged and a polishing method of polishing the object with the abrasive.

Another object of the present invention to provide a polishing method of polishing an object to be processed with an abrasive, capable of polishing various metals and intermetallic compounds thereof as the object and treating waste produced by the polishing process easily.

Yet another object of the present invention is to provide a washing method of washing an object polished with an abrasive, capable of washing away abrasive grains of the abrasive remaining on the polished object.

One of the above objects of the present invention is achieved by an abrasive including abrasive grains selected from the group including MnO, $Mn_3O_4$, and a mixture thereof and an additive that includes $NO_3^-$.

One of the above objects of the present invention is also achieved by an abrasive including abrasive grains selected from the group including MnO, $Mn_2O_3$, $Mn_3O_4$, and a mixture thereof and an additive that includes $H_2O_2$.

One of the above objects of the present invention is also achieved by an abrasive including abrasive grains selected from the group including MnO, $MnO_2$, $Mn_2O_3$, $Mn_3O_4$, and a mixture thereof and an additive that includes at least one organic acid selected from the group including gluconic acid, ortho-methylbenzoic acid, citric acid, malonic acid, and acetic acid.

One of the above objects of the present invention is also achieved by a polishing method of polishing an object with an abrasive that includes abrasive grains, including the step of mixing an additive with the abrasive, wherein the abrasive grains are selected from the group including MnO, $Mn_2O_3$, $Mn_3O_4$, and a mixture thereof and the additive includes $NO_3^-$.

One of the above objects of the present invention is also achieved by a polishing method of polishing an object with an abrasive that includes abrasive grains, including the step of mixing an additive with the abrasive, wherein the abrasive grains are selected from the group including MnO, $MnO_2$, $Mn_2O_3$, $Mn_3O_4$, and a mixture thereof and the additive includes $H_2O_2$.

One of the above objects of the present invention is also achieved by a polishing method of polishing an object with an abrasive that includes abrasive grains, including the step of mixing an additive with the abrasive, wherein the abrasive grains are selected from the group including of MnO, $MnO_2$, $Mn_2O_3$, $Mn_3O_4$, and a mixture thereof and the additive includes an organic acid.

In the above polishing method, the organic acid may be at least one organic acid selected from the group including gluconic acid, ortho-methylbenzoic acid, citric acid, malonic acid, and acetic acid.

In the above polishing methods, the object is selected from the group including Si, W, Al, Cu, Ti, TiN, Cr, Co, Fe, Ni, Nb, Mo, MoO, $Mo_2N$, Ru, RuO, Pd, Hf, Ta, TaN, WN, Ir and IrO.

One of the above objects of the present invention is also achieved by a polishing method of polishing an object, including the steps of solidifying an abrasive that includes abrasive grains selected from the group including MnO, $MnO_2$, $Mn_2O_3$, $Mn_3O_4$, and a mixture thereof and polishing the object with the solidified abrasive.

In the above polishing method, the step of solidifying the abrasive may include cooling and coagulating of the abrasive.

In the above polishing methods, the abrasive may include an additive and the additive may include $NO_3^-$, potassium phthalate, or an organic acid.

In the above polishing methods, the abrasive further includes an additive that includes an inorganic acid, potassium phthalate, an organic acid, or $H_2O_2$.

In the above polishing methods, the object may be $SiO_2$ or polysilicon.

In the above polishing methods, the object may be selected from the group including W, Al, Cu, Ti, TiN, Cr, Co, Fe, Ni, Nb, Mo, MoO, $MO_2N$, Ru, RuO, Pd, Hf, Ta, TaN, WN, Ir and IrO.

One of the above objects of the present invention is also achieved by a washing method of washing an object polished with an abrasive that includes abrasive grains selected from the group including MnO, $MnO_2$, $Mn_2O_3$, $Mn_3O_4$, and a mixture thereof, wherein the polished object is washed with a washing liquid that includes an organic acid or a lower alcohol.

In the above washing method, a temperature of the washing liquid may be equal to or more than 50° C.

BRIEF DESCRIPTION OF THE DRAWINGS

Other objects, features and advantages of the present invention will become more apparent from the following detailed description when read in conjunction with the accompanying drawings, in which:

FIGS. 1(A) through (C) are tables showing examples of materials for gate electrodes;

FIG. 4 is a table showing the result of test example 5;

FIG. 6 is a table showing the result of test example 6;

FIG. 7 is a table showing the conditions of samples of abrasives for test example 7;

FIG. 8 is a table showing the result of test example 7 (in the case of an object to be processed being Cu);

FIG. 9 is a table showing the result of test example 7 (in the case of an object to be processed being Al);

FIG. 10 is a table showing the result of test example 7 (in the case of an object to be processed being W);

FIG. 11 is a table showing the result of test example 8 (in the case of an object to be processed being Cu);

FIG. 12 is a table showing the result of test example 7 (in the case of an object to be processed being Al);

FIG. 13 is a table showing the result of test example 7 (in the case of an object to be processed being W);

FIG. 14 is a table showing the result of test example 10;

FIG. 15 is a table showing the result of test example 11 (in the case of an object to be processed being Cu);

FIG. 16 is a table showing the result of test example 11 (in the case of an object to be processed being Al);

FIG. 17 is a table showing the result of test example 12 (in the case of an object to be processed being Cu); and FIG. 18 is a table showing the result of test example 12 (in the case of an object to be processed being Al).

DETAILED DESCRIPTION OF THE PREFERRED EMBODIMENTS

FIGS. 2(A) through 2(I) are diagrams illustrating a process of fabricating a semiconductor device having a multi-layer wiring structure according to the present invention.

Figure 2A:
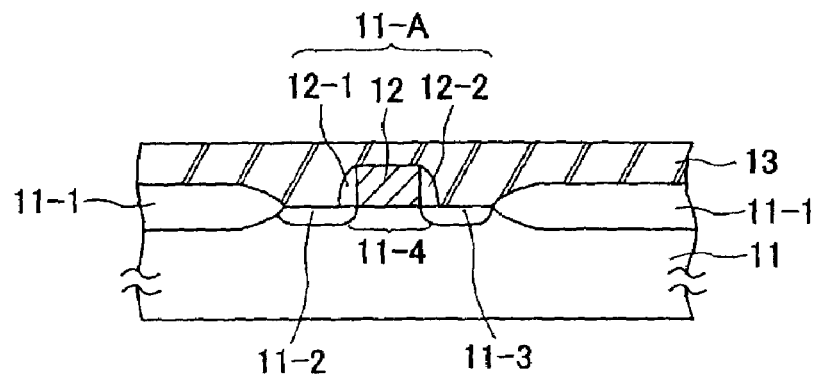
FIGS. 2(A) through (I) are diagrams illustrating a process of fabricating a semiconductor device having a multi-layer wiring structure according to the embodiment of the present invention.

As referring to FIG. 2(A), an active region 11-A is formed on a field oxide film 11-1 on a Si substrate 11, and a gate electrode 12 is formed on the substrate 11 via a gate insulating film in the active region. Furthermore, diffusing regions 11-2 and 11-3 are formed at both sides of the gate electrode 12 in the substrate 11, and moreover, a channel region 11-4 is formed just below the gate electrode 12. The gate electrode 12 supports sidewall oxide films 12-1 and 12-2 on the surfaces of the sidewalls thereof. On the substrate 11, the first interlayer insulation layer 13 is formed by a CVD (Chemical Vapor Deposition) method so as to cover the gate electrode 12.

Figure 2B:
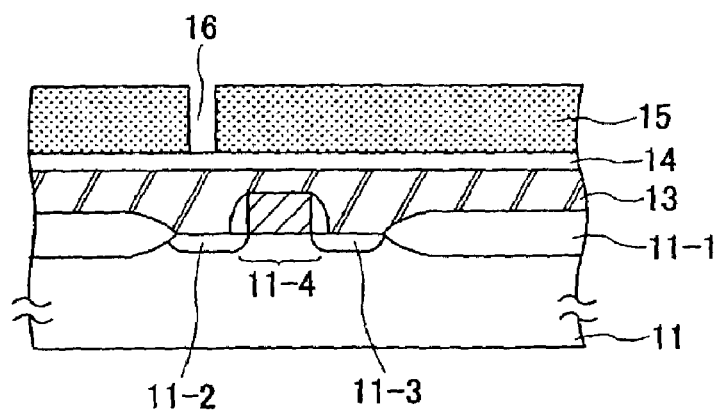

As referring to FIG. 2(B), a $Si_3N_4$ film 14 as an etching stopper is formed on the first interlayer insulation layer 13 by the CVD method. A resist 15 is formed on the $Si_3N_4$ film 14. A fine pattern for a contact hole 16 is formed on the resist 15 by a photolithographic process.

Figure 2C:
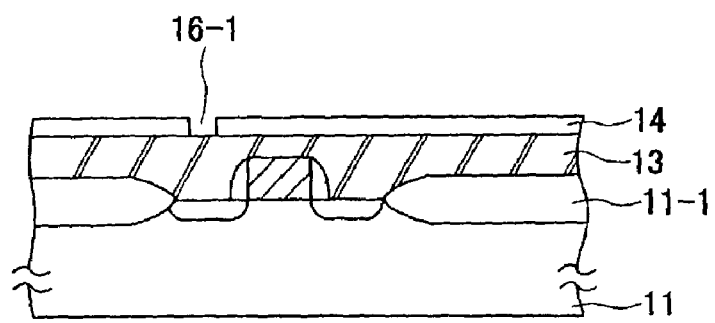

As referring to FIG. 2(C), the $Si_3N_4$ film 14 is etched using the resist 15 as a mask so as to form the pattern for the contact hole 16-1 and the resist 15 is eliminated.

Figure 2D:
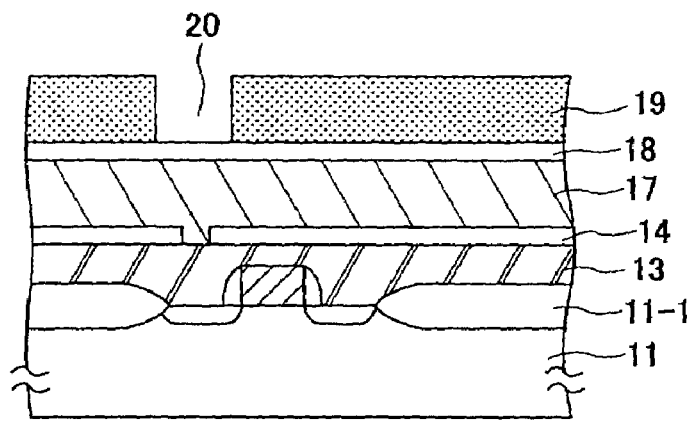

As referring to FIG. 2(D), for example, an organic thermosetting resin is applied and heated so as to form the second interlayer insulation layer 17 including an organic insulation layer. A $SiO_2$ film 18 is formed on the second interlayer insulation layer 17 by p-TEOS. Furthermore, a resist 19 is formed on the $SiO_2$ film 18 and a pattern for a wiring slot 20 is formed on the resist 19 and used as an etching mask.

Figure 2E:
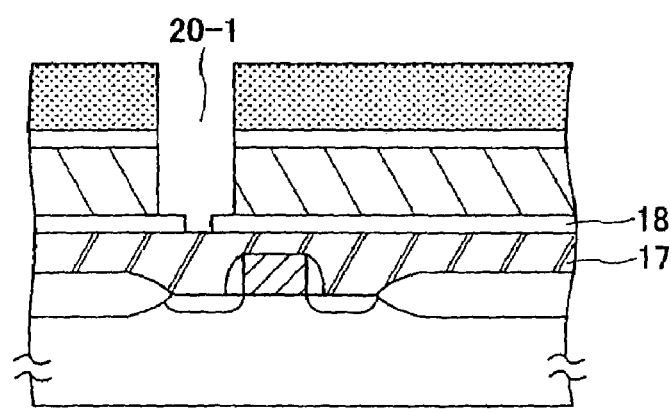

As referring to FIG. 2(E), the $SiO_2$ film 18 and the second interlayer insulation layer 17 are etched so as to form the wiring slot 20-1. In this etching, the $Si_3N_4$ film 14 becomes a stopper.

Figure 2F:
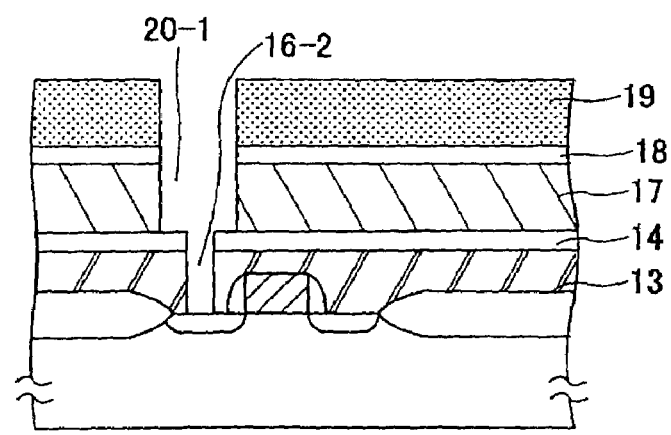

As referring to FIG. 2(F), the first interlayer insulation layer 13 is etched with the $Si_3N_4$ film 14 as a mask so as to form a contact hole 16-2 and the resist 19 is eliminated.

Figure 2G:
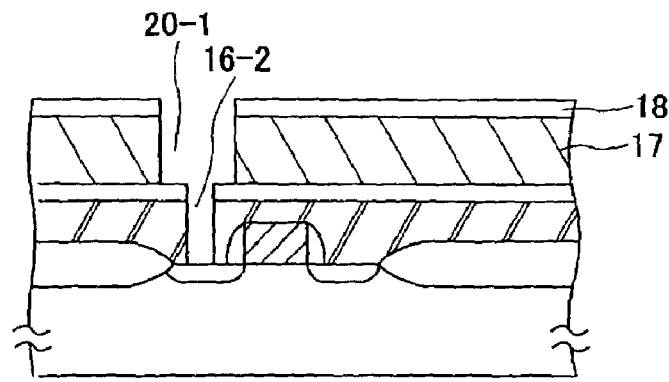

As referring to FIG. 2(G), a dual damascene structure that includes the wiring slot 20-1 and the contact hole 16-2 is formed.

Figure 2H:
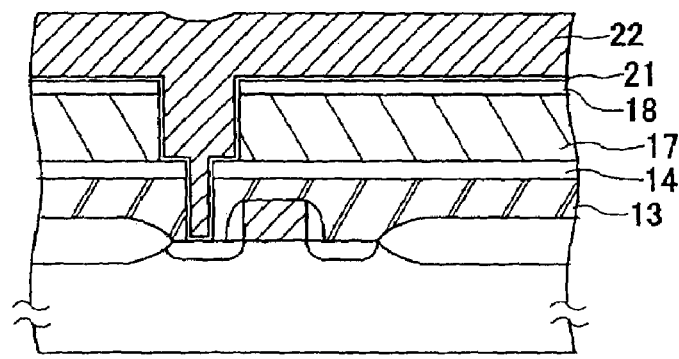

As referring to FIG. 2(H), for suppressing the diffusion of Cu as the wiring material to the first and second interlayer insulation layers 13 and 17, a TiN film 21 is formed on the inner walls of the wiring slot 20-1 and the contact hole 16-2, etc. Furthermore, a Cu film 22 is deposited by an electrolytic plating method or the CVD method.

Figure 2I:
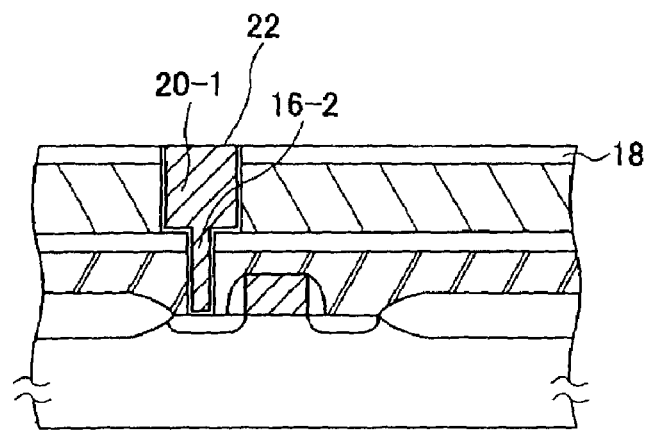

As referring to FIG. 2(I), the Cu film 22 is polished by the CMP method using an abrasive in which the abrasive grains include MnO, $Mn_2O_3$, or $Mn_3O_4$ and the additive is nitric acid $HNO_3$, until the $SiO_2$ film 18 is exposed. In such an abrasive, the polishing speed for the Cu film 22 is equal to or more than the polishing speed for the $SiO_2$ film 18 as described in detail in the following test examples. The Cu film 22 is polished selectively and the $SiO_2$ film 18 functions as a polishing stopper. Finally, the Cu film 22 is polished until the upper surface of the Cu film 22 has a co-plane with the upper surface of the $SiO_2$ film 18 and a Cu dual damascene wiring is formed in which the wiring slot 20-1 and the contact hole 16-2 are filled with the Cu film 22.

Subsequently, in order to eliminate the abrasive grains such as $Mn_2O_3$, etc., remaining on the surface, washing is made using a brush scrubber and an aqueous solution of an organic acid, and further washing is accomplished using a dilute HF solution.

Embodiments according to the present invention will be described in detail below.

Test examples 1 and 2 of the embodiments according to the present invention described below are examples in regard to abrasives in which the abrasive grains include MnO, $Mn_2O_3$, or $Mn_3O_4$ and the additive is nitric acid $HNO_3$.

TEST EXAMPLE 1

In the subject test example, an abrasive was prepared by mixing abrasive grains including MnO, $Mn_2O_3$, or $Mn_3O_4$ with an average grain diameter of 0.2 μm, an additive, and a solvent. The composition of the abrasive was adjusted by using nitric acid $HNO_3$ as the additive and $H_2O$ as the solvent such that the proportion of the abrasive grains in the abrasive was 10 wt % and pH of the abrasive was 1.5 (samples 11 through 13). An abrasive in which the abrasive grains were $MnO_2$ and the others have compositions similar to samples 11 through 13 was a comparison (sample 14).

Also, the object to be processed was provided by forming a $SiO_2$ layer with the thickness of 1 μm on a wafer by p-TEOS, subsequently forming a hole with the diameter of 0.35 μm and the height of 0.5 μm, forming a TiN layer with the thickness of 5 nm by a sputtering method, and further forming a W layer with the thickness of 500 nm by the CVD method.

Figure 3A:
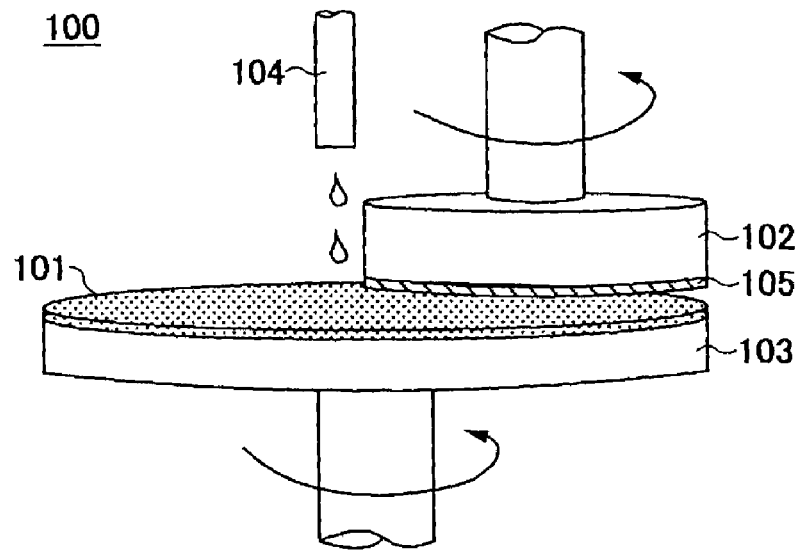
FIG. 3 is a schematic diagram showing the structure of a polishing apparatus.
Figure 3B:
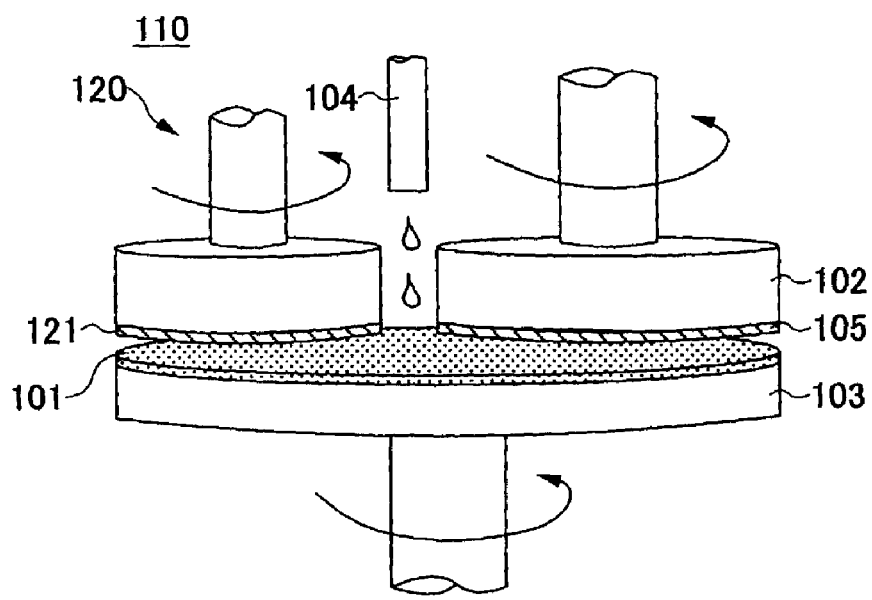

For the polishing, a polishing apparatus as shown in FIG. 3 was employed. FIG. 3(A) is a schematic diagram showing the structure of a polishing apparatus and FIG. 3(B) is a schematic diagram showing the structure of a polishing apparatus to which a dress jig is attached.

As referring to FIGS. 3(A) and (B), the polishing conditions were: IC1400 made by Rodel as the polishing cloth 101, the pressure of $3.4 \times 10^4$ Pa, the number of revolutions of the upper surface plate 102 of 50 rpm, and the number of revolution of the lower surface plate 103 of 40 rpm. Also, the abrasive was supplied from an abrasive-supplying apparatus 104, and the flow rate of the abrasive was 0.1 L/min. Additionally, an object to be processed 105, of which the surface to be processed was directed downward, was attached to the upper surface plate 102.

As referring to FIG. 3(B), a fixed grindstone 121 in which diamond abrasive grains were fixed with resin, etc., was attached to a dress jig 120. In the present test example, dressing was performed in combination with the polishing by the polishing apparatus 110 shown in FIG. 3(B).

For the test, the W layer and the TiN layer on the wafer as objects to be processed were polished for each sample of the abrasive, and over-polishing was further performed for 2 minutes. 1000 wafers were polished continuously. Subsequently, the surface of the processed object was examined by a surface inspection apparatus in regard to the presence or absence of damage.

TABLE 1

| Abrasive | Abrasive grain | Number of wafers with damage | Rate of occurrence of damage (%) |
| --- | --- | --- | --- |
| Sample 11 | MnO | 2 | 0.2 |
| Sample 12 | $Mn_2O_3$ | 1 | 0.1 |
| Sample 13 | $Mn_3O_4$ | 2 | 0.2 |
| Sample 14 (Comparison) | $MnO_2$ | 65 | 6.5 |

Table 1 shows the result of test example 1. The rate of occurrence of damage caused by the dressing with abrasives of which the abrasive grains were MnO, $Mn_2O_3$, or $Mn_3O_4$ was significantly lower than with the abrasive in which the abrasive grains were $MnO_2$ as a comparison. It is considered that for the abrasive in which the abrasive grains were $MnO_2$, resin such as epoxy resin for fixing diamond abrasive grains of the dress jig are dissolved with $MnO_2$, and the diamond abrasive grains remain on the polishing cloth so as to damage the wafer. In the cases of MnO, $Mn_2O_3$, and $Mn_3O_4$, polishing can be made without generating such a problem. This knowledge was first elucidated by a series of studies by the inventors of the present invention.

TEST EXAMPLE 2

In the subject test example, an abrasive was prepared by mixing abrasive grains including MnO, $Mn_2O_3$, or $Mn_3O_4$ that have the average grain diameter of 0.2 μm, an additive, and a solvent. Nitric acid $HNO_3$ was used as the additive, $H_2O$ was used as the solvent, the proportion of the abrasive grains in the abrasive was adjusted to 10 wt %, and pH of the abrasive was adjusted to 3.0 (samples 21 through 23). An abrasive of which abrasive grains were $MnO_2$ and other conditions were similar to those of samples 21 through 23 was used as a comparison (sample 24).

Also, an object to be processed was prepared such that a $SiO_2$ layer with the thickness of 1 μm was formed on a wafer (work 2A) and another object to be processed was also prepared such that after a $SiO_2$ layer with the thickness of 1 μm was formed on a wafer, a TiN layer with the thickness of 5 nm was formed on the $SiO_2$ layer by the sputtering method and a W layer with the thickness of 500 nm was further formed on the TiN layer by the CVD method (work 2B).

The polishing condition for the subject test example was the same as the condition for the test example 1.

For the test, the respective abrasives were used and the work 2A and the work 2B were polished for certain periods, respectively. Then, the amount of material removed by the polishing was determined and the ratio $V_W/V_{SiO2}$ of the polishing speed for the W layer to the polishing speed for the $SiO_2$ layer, the so-called selection ratio, was obtained. Herein, $V_W$ is the polishing speed for the W layer and $V_{SiO2}$ is the polishing speed for the $SiO_2$ layer.

TABLE 2

| Abrasive | Abrasive Grain | Polishing Speed Ratio $V_W/V_{SiO2}$ |
| --- | --- | --- |
| Sample 21 | MnO | 30 |
| Sample 22 | $Mn_2O_3$ | 10 |
| Sample 23 | $Mn_3O_4$ | 35 |
| Sample 24 (Comparison) | $MnO_2$ | 40 |

Table 2 shows the result of test example 2. When a metal layer is polished, it is preferable that the ratio $V_W/V_{SiO2}$ of the polishing speeds be greater. From Table 2, the selection ratios for the abrasives containing the abrasive grains of MnO, $MnO_2$, or $Mn_3O_4$ and $NO_3^-$ were equal to or more than 10. When a metal layer on an oxide film was polished, the oxide film acted as a polishing stopper.

According to the test examples 1 and 2, the selection ratio for the abrasive containing the abrasive grains of $MnO_2$ and $NO_3^-$ as a comparison are sufficient, but the rate of occurrence of damage is high so as to be a real problem. However, for the polishing with the abrasives containing the abrasive grains of MnO, $Mn_2O_3$, or $Mn_3O_4$ and $NO_3^-$ according to the present embodiment, there is very little damage by dressing and the selection ratio is equal to or more than 10. Also, when a metal layer on an oxide film is polished, the oxide film can act as a polishing stopper.

Test example 3 of the embodiment according to the present invention mentioned below is an example of an abrasive having abrasive grains including MnO or $MnO_2$ and an organic acid as an additive.

TEST EXAMPLE 3

In the subject test example, an abrasive was prepared by mixing abrasive grains including MnO, $MnO_2$, $Mn_2O_3$, or $Mn_3O_4$ with an average grain diameter of 0.2 μm and a solvent. $H_2O$ was used as the solvent and the composition of the abrasive was adjusted such that the proportion of the abrasive grains in the abrasive was 10 wt % (samples 31 through 34).

Then, the test was performed on the two conditions of providing and not providing a solution containing, for example, 5 wt % of an organic acid. The solution was provided to a polishing apparatus through a route different from the route for the abrasive. Herein, the organic acid was gluconic acid ($C_6H_{12}O_7$), ortho-methyl benzoic acid ($CH_3$—$C_6H_4$—COOH), citric acid ($C_6H_8O_7$), malonic acid ($CH_2(COOH)_2$) or acetic acid ($CH_3COOH$).

Also, one object to be processed was such that a $SiO_2$ layer with the thickness of 1 μm was formed on a wafer (work 3A) and another object to be processes was such that after a $SiO_2$ layer with the thickness of 1 μm was formed on a wafer, a TiN layer with the thickness of 5 nm was formed on the $SiO_2$ layer by the sputtering method and a Cu layer, an Al layer, or a W layer with the thickness of 500 nm was further formed on the TiN layer by the CVD method (works 3B through 3D).

The polishing condition for the subject test example was the same as the condition for the test example 1.

For the test, respective abrasives were used and the works 3A through 3D as the objects to be processed were polished for certain periods on the conditions of providing and not providing the solution containing the organic acid. Then, the amounts of material removed by polishing were determined for works 3A through 3D on the respective conditions and the polishing speeds for the Cu layer, the Al layer, the W layer and the $SiO_2$ layer were obtained.

The polishing speed for the $SiO_2$ layer was lowered as the organic acid was supplied. Also, the Cu layer, the Al layer, and the W layer were not corroded by the organic acid. Accordingly, when a metal layer on an oxide film is polished, the metal layer only can be polished and the oxide film can act as a polishing stopper.

Additionally, in the subject test example, the solution containing the organic acid was provided to a polishing apparatus through a route different from the route for the abrasive. However, the solution containing the organic acid may be mixed with the abrasive just before the mixture is provided to the polishing apparatus.

Test example 4 of the embodiment according to the present invention mentioned below is an example of a method of fabricating a semiconductor device polished by using $H_2O_2$ solution.

TEST EXAMPLE 4

In the subject test example, an abrasive was prepared by mixing abrasive grains including MnO, $MnO_2$, $Mn_2O_3$, or $Mn_3O_4$ with an average grain diameter of 0.2 μm and a solvent. $H_2O$ was used as the solvent and the composition of the abrasive was adjusted such that the proportion of the abrasive grains in the abrasive was 10 wt % (samples 41 through 44).

Also, one object to be processed was formed such that after an oxide film with the thickness of 20 nm was formed by means of thermal oxidation of a Si wafer, a TiN layer with the thickness of 5 nm was formed on the Si wafer by the sputtering method and an Ir layer with the thickness of 100 nm was further formed on the TiN layer by the CVD method (work 4A). Another object to be processed was formed such that after an oxide film with the thickness of 20 nm was formed by means of thermal oxidation of a Si wafer, a Ta layer with the thickness of 50 nm was formed on the Si wafer by a sputtering method (work 4B). The lamination structure of works 4A and 4B were as follows.

Work 4A: Ir layer (100 nm)/TiN layer (5 nm)/$SiO_2$ layer (20 nm)/Si substrate

Work 4B: Ta layer (50 nm)/$SiO_2$ layer (20 nm)/Si substrate

The polishing conditions were two conditions of providing and not providing an aqueous solution containing 5 wt % of $H_2O_2$. Herein, the $H_2O_2$ aqueous solution was provided to a polishing apparatus by a route different from the route for the abrasive. Other polishing conditions were the same as the conditions for the test example 1.

For the test, the respective abrasives were used and the works 4A and 4B as the objects to be processed were polished for certain periods on the conditions of providing and not providing the $H_2O_2$ aqueous solution. Then, on each condition, the amount of material removed by polishing was determined for works 4A and 4B and the ratio $V_{H2O2}/V_o$ of the polishing speeds for the cases of providing and not providing the $H_2O_2$ aqueous solution was obtained. Herein, $V_{H2O2}$ is the polishing speed for the case of providing the $H_2O_2$ aqueous solution and $V_o$ is the polishing speed for the case of not providing the $H_2O_2$ aqueous solution.

TABLE 3

| Abrasive | Abrasive grain | Object to be processed | $V_{H2O2}/V_O$ |
| --- | --- | --- | --- |
| Sample 41 | MnO | Work 4A (Ir) | 960 |
|  |  | Work 4B (Ta) | 240 |
| Sample 42 | $MnO_2$ | Work 4A (Ir) | 970 |
|  |  | Work 4B (Ta) | 260 |
| Sample 43 | $Mn_2O_3$ | Work 4A (Ir) | 980 |
|  |  | Work 4B (Ta) | 250 |
| Sample 44 | $Mn_3O_4$ | Work 4A (Ir) | 1000 |
|  |  | Work 4B (Ta) | 240 |

Table 3 shows the result of the subject test example. As referring to Table 3, when the Ir layer or the Ta layer as the object to be processed was polished using the abrasive with the abrasive grains of MnO, $MnO_2$, $Mn_2O_3$, or $Mn_3O_4$, the polishing speed for the case of providing the $H_2O_2$ aqueous solution was increased, compared to the case of non-providing the $H_2O_2$ aqueous solution. Then, although there has not yet been provided an abrasive capable of polishing an Ir layer and a Ta layer being chemically stable, the Ir layer and the Ta layer can be polished efficiently according to the subject test example.

Additionally, in the subject test example, the $H_2O_2$ aqueous solution was provided to a polishing apparatus by a route different from the route for the abrasive. However, the $H_2O_2$ solution may be mixed with the abrasive just before the mixture is provided to the polishing apparatus.

Test example 5 of the embodiment according to the present invention mentioned below is an example of a method of fabricating a semiconductor device polished with an abrasive containing abrasive grains including MnO, $MnO_2$, $Mn_2O_3$, or $Mn_3O_4$ and an additive provided by routes different from each other.

TEST EXAMPLE 5

In the subject test example, an abrasive was prepared by mixing abrasive grains including MnO, $MnO_2$, $Mn_2O_3$, or $Mn_3O_4$ with an average grain diameter of 0.2 μm and a solvent (Samples 51 through 54). $H_2O$ was used as the solvent and the composition of the abrasive was adjusted such that the proportion of the abrasive grains in the abrasive was 10 wt %.

In respect to the polishing condition, a supplied solution containing an additive shown in each of the following polishing conditions 1 through 9 was provided to a polishing apparatus at a rate of 0.1 L/min, and other conditions were similar to those of the test example 1.

Also, for the object to be processed, a 200 nm $SiO_2$ layer was formed on a Si substrate, and one of the following various conductive films with the thickness of 50 nm was formed on the substrate by the sputtering method.

In respect to the test, the objects to be processed (works 5I through 5J) were polished with the respective abrasives (Samples 51 through 54) for 3 minutes on the polishing conditions. Also, whether a material of the object to be processed remained on the top surface or not was determined. Then, the case of not remaining, where the material of the top surface was entirely polished, was judged to be polishable (O) and the case of remaining was judged to be not-polishable (X).

(Abrasives)

Sample 51: abrasive grains of $MnO_2$, 10 wt % of solid content, no additive

Sample 52: abrasive grains of $Mn_2O_3$, 10 wt % of solid content, no additive

Sample 53: abrasive grains of $Mn_3O_4$, 10 wt % of solid content, no additive

Sample 54: abrasive grains of MnO, 10 wt % of solid content, no additive (Polishing Conditions)

Polishing condition 51 (comparison): supplied solution of only $H_2O$

Polishing condition 52: supplied solution of $HNO_3$ aqueous solution at $pH_2$

Polishing condition 53: supplied solution of 10 wt % of Potassium phthalate aqueous solution.

Polishing condition 54: supplied solution of 10 wt % of gluconic acid ($C_6H_{12}O_7$) aqueous solution Polishing condition 55: supplied solution of 5 wt % of ortho-methylbenzoic acid ($CH_3$—$C_6H_4$—$COOH$) aqueous solution Polishing condition 56: supplied solution of 10 wt % of citric acid ($C_6H_8O_7$) aqueous solution Polishing condition 57: supplied solution of 10 wt % of malonic acid ($CH_2(COOH)_2$) aqueous solution Polishing condition 58: supplied solution of acetic acid ($CH_3COOH$) aqueous solution at $pH_3$ Polishing condition 59: supplied solution of 10 vol % of $H_2O_2$ aqueous solution.

The film structure of the objects to be processed will be shown below. Herein, the Si substrate and the $SiO_2$ (200 nm) formed thereon are omitted.

Work 51: Ti(50 nm)
Work 52: TiN(50 nm)
Work 53: Cr(50 nm)/TiN(50 nm)
Work 54: Co(50 nm)/TiN(50 nm)
Work 55: Fe(50 nm)/TiN(50 nm)
Work 56: Ni(50 nm)/TiN(50 nm)
Work 57: Nb(50 nm)/TiN(50 nm)
Work 58: Mo(50 nm)/TiN(50 nm)
Work 59: MoO(50 nm)/TiN(50 nm)
Work 5A: $Mo_2N$(50 nm)/TiN(50 nm)
Work 5B: Ru(50 nm)/TiN(50 nm)
Work 5C: RuO(50 nm)/TiN(50 nm)
Work 5D: Pd(50 nm)/TiN(50 nm)
Work 5E: Hf(50 nm)/TiN(50 nm)
Work 5F: Ta(50 nm)/TiN(50 nm)
Work 5G: TaN(50 nm)/TiN(50 nm)
Work 5H: WN(50 nm)/TiN(50 nm)
Work 5I: Ir(50 nm)/TiN(50 nm)
Work 5J: IrO(50 nm)/TiN(50 nm).

Figure 4:
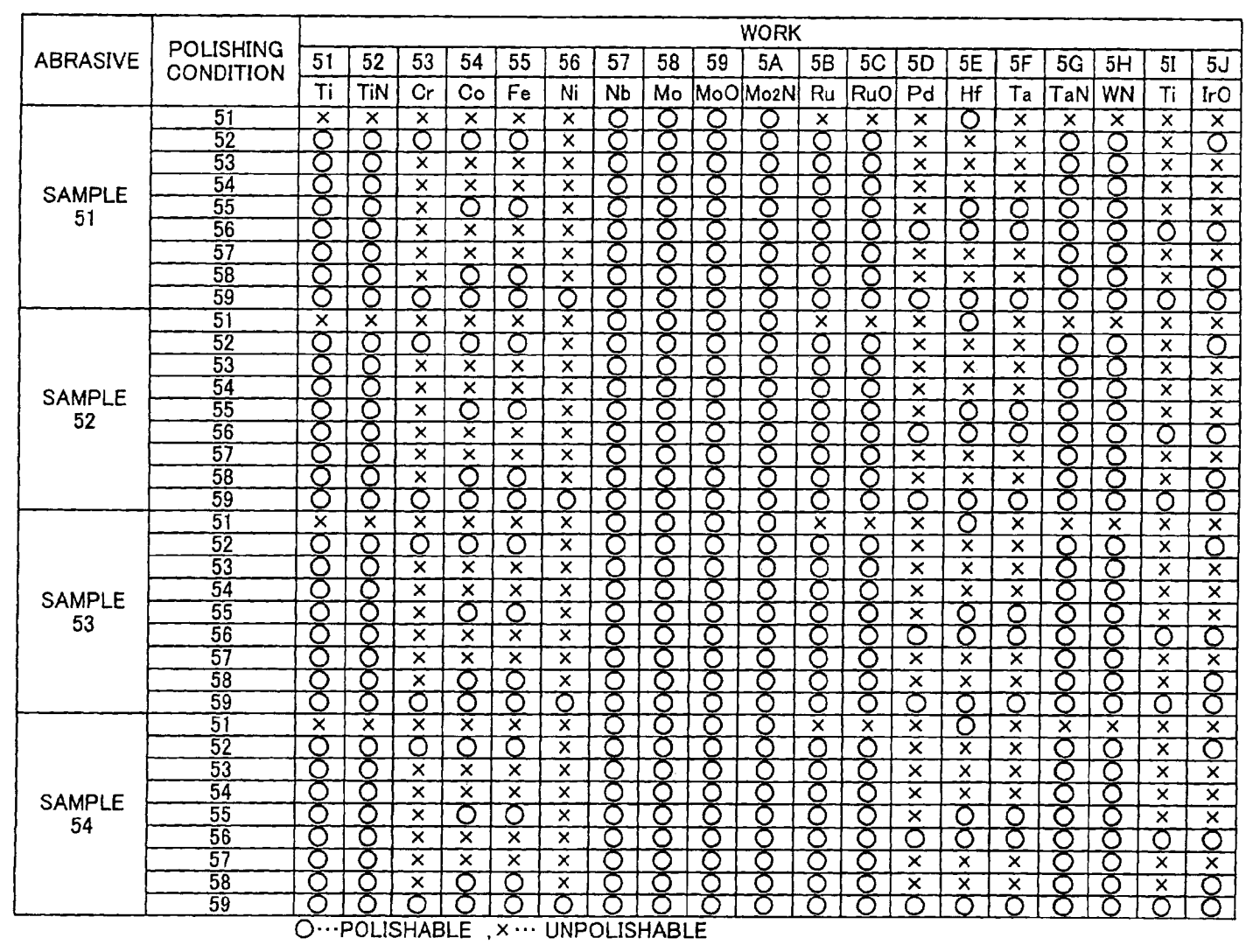

FIG. 4 is a table showing the result of the subject test example. As referring to FIG. 4, for the kinds of polishable metals and intermetallic compounds thereof for all samples for the abrasives and the additive of $HNO_3$, the organic acids such as gluconic acid, etc., and $H_2O_2$ in the polishing conditions 52 through 59 were more than in the polishing condition 51 as a comparison, where only $H_2O$ was supplied. Particularly, when the $HNO_3$ solution was provided, metals except Ni, Pd, Hf, Ta, and Ir and intermetallic compounds thereof were polishable. Furthermore, in the case of the polishing conditions 9 using $H_2O_2$ solution, all metals and intermetallic compounds thereof in the subject test example were polishable. Therefore, many kinds of metals and intermetallic compounds thereof used in a semiconductor device can be polished with one kind of abrasive provided by supplying an additive according to the subject test example to the abrasive in which abrasive grains of any of Mno, $MnO_2$, $Mn_2O_3$, and $Mn_3O_4$ are mixed with a solvent thereof. Accordingly, since the kinds of abrasive grain components used can be controlled to generate a minimum of polishing waste, the waste is easily treated, recovered, and recycled.

Also, since the additive is provided by a route different from the route for the abrasive, a dispersing agent for improving the dispersion property of the abrasive grains may be added to the abrasive, independent of the composition of the additive.

Test example 6 of the embodiment according to the present invention mentioned below is an example of a method of fabricating a semiconductor device polished with a solid abrasive prepared by cooling and solidifying abrasive grains including MnO, $MnO_2$, $Mn_2O_3$, or $Mn_3O_4$ and a solvent thereof.

TEST EXAMPLE 6

In the subject test example, abrasive grains including $MnO_2$, $Mn_2O_3$, $Mn_3O_4$, or MnO with an average grain diameter of 0.2 μm and $H_2O$ as a solvent thereof were used. The abrasive grains were mixed with the solvent, and the mixture was cooled and solidified so as to form a solid abrasive. The composition of the abrasive was adjusted such that the proportion of the abrasive grains in the abrasive was 50 wt % (Samples 61 through 64). Additionally, the solid abrasive was also cooled with liquid nitrogen in order to keep the solid abrasive cold.

In addition, an abrasive of which the abrasive grains were silica with an average grain diameter of 0.2 μm was prepared and then the prepared abrasive was solidified similarly, so as to provide a comparison (Sample 65). Furthermore, unsolidified abrasives were prepared as comparisons (Samples 66 through 6A).

Also, an object to be processed was formed such that a $SiO_2$ layer with the thickness of 1 μm was formed on a wafer by p-TEOS (work 61). Another object to be processed was formed such that a $SiO_2$ layer with the thickness of 0.2 μm was formed on a wafer by p-TEOS and a polysilicon layer with the thickness of 1 μm was formed on the $SiO_2$ layer by the CVD method.

Figure 5:
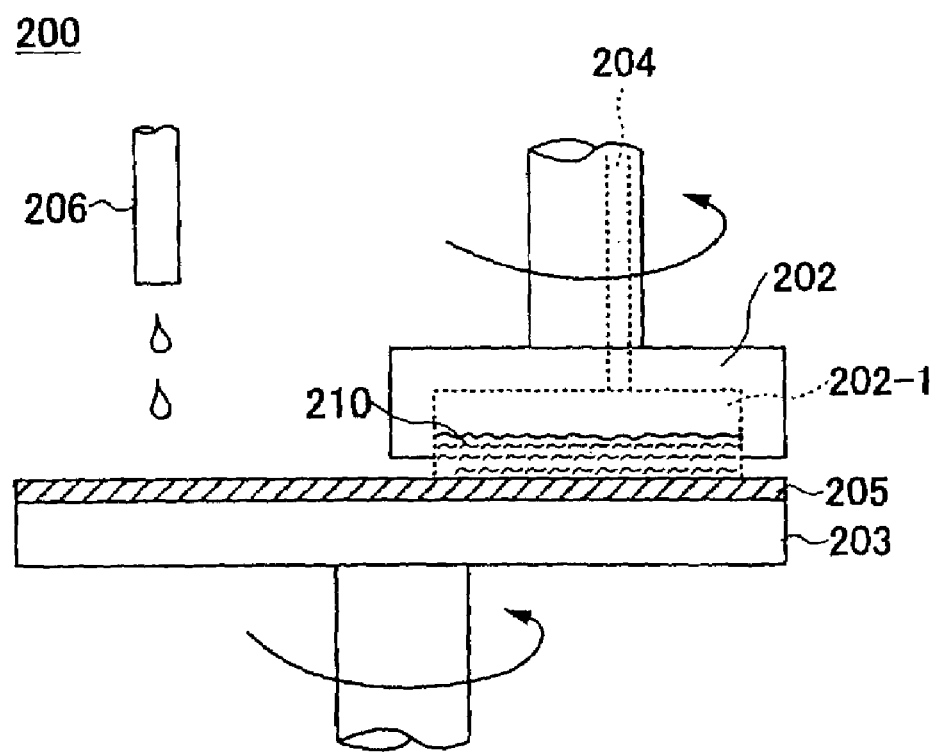
FIG. 5 is a schematic diagram showing the structure of a polishing apparatus.

The solid abrasive was provided to the polishing apparatus shown in FIG. 5. FIG. 5 is a schematic diagram of the polishing apparatus used in the subject test example. The polishing apparatus 200 includes an upper surface plate 202 and a lower surface plate 203. An object to be processed 205 was fixed on the lower surface plate 203 and the object to be processed 205 was rotated with a certain number of revolutions. The side of the upper surface plate 202 facing the object to be processed is in the form of a cylinder, of which the inside is a cavity part 202-1 as a cavity. The cavity part 202-1 holds a solid abrasive, in which a hold-back agent such as ice is mixed, and is cooled with liquid nitrogen, etc. The cavity part 202-1 is connected with a pressurized-air supplying route 204 provided on a driving shaft of the upper surface plate 202. The solid abrasive is also pressurized so as to pass through the route 204 from the outside of the upper surface plate 202. Due to the rotation of the upper surface plate 202, the solid abrasive 210 held on the cavity part 202-1 gradually melts in a region contacting the surface of the object to be processed 205 and the melted abrasive polishes the object to be processed 205.

$H_2O$ was supplied through an additive supplying route 206 on the conditions of $9.8 \times 10^3$ Pa as the pressure, $1.47 \times 10^4$ Pa as the pressure of the pressurized air in the pressurized air supplying route 204, 2000 rpm as the number of revolutions of the upper surface plate 202, and 70 rpm as the number of revolutions of the lower surface plate 203 (polishing condition 61). Additionally, since air leaks from a gap between the solid abrasive and the cavity part 202-1, the pressure of the pressurized air applied on the surface of the object to be processed 205 is reduced.

For abrasive samples 66 through 6A, the polishing apparatus 100 and the polishing conditions similar to those of the test example, in which the abrasive is free abrasive grains, were employed (polishing condition 62).

(Abrasives)

Sample 61: the solid abrasive, the abrasive grains of $MnO_2$ (20 wt %), the hold-back agent of ice, none of the additive Sample 62: the solid abrasive, the abrasive grains of $Mn_2O_3$ (20 wt %), the hold-back agent of ice, none of the additive Sample 63: the solid abrasive, the abrasive grains of $Mn_3O_4$ (20 wt %), the hold-back agent of ice, none of the additive Sample 64: the solid abrasive, the abrasive grains of MnO (20 wt %), the hold-back agent of ice, none of the additive Sample 65 (Comparison): the solid abrasive, the abrasive grains of $SiO_2$ (20 wt %), none of the additive Sample 66 (Comparison): the liquid abrasive, the abrasive grains of $MnO_2$, 10 wt % of the solid content, none of the additive Sample 67 (Comparison): the liquid abrasive, the abrasive grains of $Mn_2O_3$, 10 wt % of the solid content, none of the additive Sample 68 (Comparison): the liquid abrasive, the abrasive grains of $Mn_3O_4$, 10 wt % of the solid content, none of the additive Sample 69 (Comparison): the liquid abrasive, the abrasive grains of MnO, 10 wt % of the solid content, none of the additive Sample 6A (Comparison): the liquid abrasive, the abrasive grains of $SiO_2$, 10 wt % of the solid content, none of the additive (Objects to be Processed)

Work 61: $SiO_2$ (1 μm)/wafer

Work 62: Polysilicon (1 μm)/$SiO_2$(0.2 μm)/wafer

FIG. 6 is a table showing the result of the subject test example. As referring to FIG. 6, the polishing speed of the abrasive containing silica ($SiO_2$) of sample 65 as a comparison is greatly lowered, compared to the liquid abrasive containing silica of sample 6A as a comparison. However, the solid abrasive of which the abrasive grains are $MnO_2$, $Mn_2O_3$, $Mn_3O_4$, or MnO according to the test example of the present invention has a polishing speed similar to that of the liquid abrasive as a comparison (samples 66 through 69). Also, the mass of the solid abrasive grains necessary for polishing the object to be processed by 1 μm according to the test example of the present invention is 10% of the mass of the liquid abrasive grains necessary for polishing the object to be processed by 1 μm. Therefore, the solid abrasive according to the test example of the present invention can significantly reduce the amount of waste produced in the abrasive process.

Test example 7 of the embodiment according to the present invention mentioned below is an example of a method of fabricating a semiconductor device polished with a solid abrasive provided by cooling and solidifying abrasive grains including MnO, $MnO_2$, $Mn_2O_3$, and $Mn_3O_4$, a solvent, and an additive.

TEST EXAMPLE 7

In the subject test example, the abrasive grains including MnO, $MnO_2$, $Mn_2O_3$, or $Mn_3O_4$ with the average grain diameter of 0.2 μm and $H_2O$ as the solvent thereof were used. The abrasive grains, the solvent and the additive were mixed so as to form the abrasive and the mixture was cooled and solidified. As the additive, each of $HNO_3$, potassium phthalate, and ortho-methylbenzoic acid was used as shown below. The composition of the abrasive was adjusted such that the proportion of the abrasive grains in the abrasive was 20 wt % (Samples 71 through 7G). Also, in order to keep the solid abrasive cold, the solid abrasive was further cooled with liquid nitrogen.

As a comparison, an abrasive was prepared by using the abrasive grains, the solvent, and the additive similar to those of the samples 71 through 7G without cooling and solidifying. Herein, the composition of the abrasive was adjusted such that the proportion of the abrasive grains in the abrasive was 10 wt % (samples 7H through 7W).

As the object to be processed, after a $SiO_2$ layer with the thickness of 200 nm was formed on a Si substrate by p-TEOS, a Ta layer with the thickness of 5 nm was formed on the $SiO_2$ layer by the sputtering method, and a Cu layer with the thickness of 800 nm was further formed on the Ta layer by the sputtering method (work 71). Also, after a $SiO_2$ layer with the thickness of 200 nm was formed on a Si substrate by p-TEOS, a TiN layer with the thickness of 50 nm was formed on the $SiO_2$ layer by the sputtering method, and an Al layer with the thickness of 800 nm was further formed on the TiN layer by the sputtering method (work 72). Furthermore, after a $SiO_2$ layer with the thickness of 200 nm was formed on a Si substrate by p-TEOS, a TiN layer with the thickness of 50 nm was formed on the $SiO_2$ layer by the sputtering method, and a W layer with the thickness of 800 nm was further formed on the TiN layer by the CVD method (work 73). Moreover, as a comparison, a $SiO_2$ layer with the thickness of 1 μm was formed on a Si substrate by p-TEOS (work 74).

The polishing condition of the solid abrasives (sample 71 through 7G) was similar to the polishing condition 61 of the test example 6 (polishing condition 71). Also, the abrasive condition of the abrasives including free abrasive grains (samples 7H thorough 7W) was similar to the abrasive condition 62 of the test example 6 (abrasive condition 72).

FIG. 7 is a table showing the conditions of the samples of the abrasive. Also, the film structure of the objects to be processed will be shown below. Herein, the Si substrate is omitted.

Work 71: Cu (800 nm)/Ta(5 nm)/$SiO_2$ (200 nm)

Work 72: Al (800 nm)/TiN(50 nm)/$SiO_2$ (200 nm)

Work 73: W (800 nm)/TiN(50 nm)/$SiO_2$ (200 nm)

Work 74: $SiO_2$ (1 μm)

FIGS. 8 through 10 are diagrams showing the result of the subject test example. FIG. 8 shows the case where the top surface layer of the object to be processed was made from Cu (work 71). FIG. 9 shows the case where the top surface layer of the object to be processed was made from Al (work 72). FIG. 10 shows the case where the top surface layer of the object to be processed was made from W (work 73). In respective diagrams, the case where the top surface layer as an insulation layer was made from $SiO_2$ (work 74) is also shown for comparison.

According to FIGS. 8 through 10, the polishing speed for $SiO_2$ can be reduced by adding $HNO_3$, potassium phthalate, or ortho-methylbenzoic acid as the additive to the abrasive, compared to the case of none of the additive.

On the other hand, the polishing speeds for Cu, Al, and W were similarly increased by the addition of $HNO_3$, potassium phthalate, gluconic acid, ortho-methylbenzoic acid, citric acid, malonic acid, or acetic acid. Particularly, the polishing speeds in the cases of Cu and Al were significantly increased so as to improve the selectivity of the polishing.

Therefore, the selectivity for polishing the metal layers and $SiO_2$ layer can be improved by the solid abrasive prepared by cooling and solidifying the abrasive which is formed by mixing the abrasive grains including each of $MnO_2$, $Mn_2O_3$, $Mn_3O_4$, and MnO, with $H_2O$ as the solvent, and the additive of $HNO_3$, potassium phthalate, gluconic acid, ortho-methylbenzoic acid, citric acid, malonic acid, or acetic acid. Thus the solid abrasive can be used for metal-embedding polishing in a process of fabricating a semiconductor device. Additionally, the loading of the abrasive grains can be reduced.

Test example 8 of the embodiment according to the present invention mentioned below is an example of a method of fabricating a semiconductor device polished by supplying a solid abrasive obtained by solidifying the abrasive in which an additive is not added, and an additive such as $HNO_3$, etc., using an additive feeder.

TEST EXAMPLE 8

The abrasive grains including $MnO_2$, $Mn_2O_3$, $Mn_3O_4$, or MnO with an average grain diameter of 0.2 μm and $H_2O$ as the solvent were used and mixed without addition of an additive, so as to form the abrasive, which was subsequently cooled and solidified. The composition of the abrasive was adjusted such that the proportion of the abrasive grains in the abrasive was 20 wt % (Samples 81 through 84). Also, in order to keep the solid abrasive cold, the solid abrasive was further cooled with liquid nitrogen.

The objects to be processed similar to those of works 71 through 74 of the test example 7 were used (works 81 through 84).

The abrasive condition was similar to the polishing condition 61 of the test example 6 and the additive shown below was supplied on a surface to be polished by the additive feeder shown in FIG. 5 (polishing conditions 81 through 84).

(Abrasives)

Sample 81: Abrasive grains of $MnO_2$ (20 wt %), a hold-back agent, ice, none of additive Sample 82: Abrasive grains of $Mn_2O_3$ (20 wt %), a hold-back agent, ice, none of additive Sample 83: Abrasive grains of $Mn_3O_4$ (20 wt %), a hold-back agent, ice, none of additive Sample 84: Abrasive grains of MnO (20 wt %), a hold-back agent, ice, none of additive (Polishing Conditions)

Polishing condition 81 (comparison): supplied solution of only $H_2O$

Polishing condition 82: supplied solution of $HNO_3$ aqueous solution at pH 2

Polishing condition 83: supplied solution of 10 wt % of potassium phthalate aqueous solution Polishing condition 84: supplied solution of 5 wt % of ortho-methylbenzoic acid aqueous solution FIGS. 11 through 13 are tables showing the results of the subject test example. FIG. 11 shows the case where the top surface layer of the object to be processed was made from Cu (work 81). FIG. 12 shows the case where the top surface layer of the object to be processed was made from Al (work 82). FIG. 13 shows the case where the top surface layer of the object to be processed was made from W (work 83). In respective diagrams, the case where the top surface layer as an insulation layer was made from $SiO_2$ (Work 74) is also shown for comparison.

As referring to FIGS. 11 through 13, the polishing speed for $SiO_2$ can be reduced and the polishing speeds for Cu, Al, and W were comparable or increased in the case of supplying $HNO_3$, potassium phthalate, or ortho-methylbenzoic acid as the additive, compared to the case of supplying only $H_2O$ as the additive to the solid abrasive in the polishing apparatus, so as to improve the selectivity for the polishing. In particular, the polishing speeds for Cu and Al were significantly increased, so as to improve the selectivity for the polishing significantly. Furthermore, when the object to be processed was made from Cu or Al, the abrasive grains necessary for polishing by 1 μm were significantly reduced by supplying such additive, compared to the case of supplying only $H_2O$. Accordingly, the loading of the abrasive grains can be significantly reduced by supplying the additive to the solid abrasive.

Test example 9 of the embodiment according to the present invention mentioned below is an example of a method of fabricating a semiconductor device polished with a solid abrasive obtained by solidifying an abrasive without an additive or a solid abrasive obtained by solidifying an abrasive in which $H_2O_2$ is added as an additive.

TEST EXAMPLE 9

The solid abrasives were formed for abrasive grains of $MnO_2$, $Mn_2O_3$, $Mn_3O_4$, or MnO, respectively, similar to test example 8 (samples 91 through 94). Also, in order to keep the solid abrasive cold, the solid abrasives were further cooled with liquid nitrogen.

The objects to be processed similar to those of works 4A and 4B of test example 4 were used (works 91 and 92). The top surface layers of them were an Ir layer and a Ta layer, respectively.

The polishing condition was similar to polishing condition 61 of test example 6, and $H_2O_2$ aqueous solution (concentration of 3 wt %) was supplied on a surface to be polished from the additive feeder 206 in FIG. 5. On the other hand, the case of supplying only $H_2O$ was a comparison.

(Abrasives)

Sample 81: abrasive grains of $MnO_2$ (20 wt %), a hold-back agent of ice, none of additive Sample 82: abrasive grains of $Mn_2O_3$ (20 wt %), a hold-back agent of ice, none of additive Sample 83: abrasive grains of $Mn_3O_4$ (20 wt %), a hold-back agent of ice, none of additive Sample 84: abrasive grains of MnO (20 wt %), a hold-back agent of ice, none of additive

TABLE 4

| Abrasive | Abrasive grain | Object to be processed | $V_{H2O2}/V_o$ |
|---|---|---|---|
| 91 | $MnO_2$ | Ir | 920 |
| 91 | | Ta | 260 |
| 92 | $Mn_2O_3$ | Ir | 940 |
| 92 | | Ta | 240 |
| 93 | $Mn_3O_4$ | Ir | 960 |
| 93 | | Ta | 230 |
| 94 | MnO | Ir | 950 |
| 94 | | Ta | 240 |

Table 4 shows the result of the subject test example. According to Table 4, the polishing speeds for the Ir layer and the Ta layer were significantly increased in the case of supplying $H_2O_2$ solution, compared to the case of supplying only $H_2O$ to the solid abrasive.

Accordingly, when the material for wiring of a semiconductor device is Ir or Ta, although there has been provided no abrasive useful for polishing because of the chemical stability, an Ir layer and a Ta layer can be polished efficiently according to the subject test example.

Test example 10 of the embodiment according to the present invention mentioned below is an example of a method of fabricating a semiconductor device polished with a solid abrasive obtained by solidifying one abrasive in which an additive is not included or another abrasive in which an additive of $HNO_3$, potassium phthalate, an organic acid, or $H_2O_2$ is included.

TEST EXAMPLE 10

Similar to test example 8, the solid abrasive including abrasive grains of $MnO_2$, $Mn_2O_3$, $Mn_3O_4$, or MnO was formed (samples 101 through 104). Also, in order to keep the solid abrasive cold, the solid abrasive was further cooled with liquid nitrogen.

The objects to be processed were similar to works 51 through 5J of test example 5 (works 101 through 10J).

In respect to the polishing condition, a solution to be supplied that contains each of additives for the polishing conditions 101 through 109 mentioned below was supplied to the polishing apparatus 200 at the rate of 0.1 l/min by the additive feeder 206, and other conditions were similar to polishing condition 61 of test example 6.

(Abrasives)

Sample 101: abrasive grains of $MnO_2$, 20 wt % of solid content, a hold-back agent of ice, none of additive Sample 102: abrasive grains of $Mn_2O_3$, 20 wt % of solid content, a hold-back agent of ice, none of additive Sample 103: abrasive grains of $Mn_3O_4$, 20 wt % of solid content, a hold-back agent of ice, none of additive Sample 104: abrasive grains of MnO, 20 wt % of solid content, a hold-back agent of ice, none of additive (Polishing Conditions)

Polishing condition 101: supplied solution of only $H_2O$

Polishing condition 102: supplied solution of $HNO_3$ aqueous solution at pH 12

Polishing condition 103: supplied solution of 10 wt % of potassium phthalate aqueous solution Polishing condition 104: supplied solution of 10 wt % of gluconic acid ($C_6H_{12}O_7$) aqueous solution Polishing condition 105: supplied solution of 5 wt % of ortho-methylbenzoic acid ($CH_3$—$C_6H_4$—COOH) aqueous solution Polishing condition 106: supplied solution of 10 wt % of citric acid ($C_6H_8O_7$) aqueous solution Polishing condition 107: supplied solution of 10 wt % of malonic acid ($CH_2(COOH)_2$) aqueous solution Polishing condition 108: supplied solution of acetic acid ($CH_3COOH$) aqueous solution at pH 3

Polishing condition 109: supplied solution of 10 vol % of $H_2O_2$ aqueous solution The film structure of the objects to be processed will be shown below. Herein, the Si substrate and the $SiO_2$ (200 nm) formed thereon are omitted.

Work 101: Ti (50 nm)
Work 102: TiN (50 nm)
Work 103: Cr (50 nm)/TiN (50 nm)
Work 104: Co (50 nm)/TiN (50 nm)
Work 105: Fe (50 nm)/TiN (50 nm)
Work 106: Ni (50 nm)/TiN (50 nm)
Work 107: Nb (50 nm)/TiN (50 nm)
Work 108: Mo (50 nm)/TiN (50 nm)
Work 109: MoO (50 nm)/TiN (50 nm)
Work 10A: $Mo_2N$ (50 nm)/TiN (50 nm)
Work 10B: Ru (50 nm)/TiN (50 nm)
Work 10C: RuO (50 nm)/TiN (50 nm)
Work 10D: Pd (50 nm)/TiN (50 nm)
Work 10E: Hf (50 nm)/TiN (50 nm)
Work 10F: Ta (50 nm)/TiN (50 nm)
Work 10G: TaN (50 nm)/TiN (50 nm)
Work 10H: WN (50 nm)/TiN (50 nm)
Work 10I: Ir (50 nm)/TiN (50 nm)
Work 10J: IrO (50 nm)/TiN (50 nm)

FIG. 14 is a table showing the result of the subject test example. According to FIG. 14, the kinds of polishable metals and intermetallic compounds thereof for all the samples of the solid abrasives in the cases of $HNO_3$, an organic acid such as gluconic acid, etc. and $H_2O_2$ are much more than in the case of supplying only water as polishing condition 101. In particular, when $HNO_3$ solution is supplied, metals except Ni, Hf, and Ir and intermetallic compounds thereof can be polished. Furthermore, in the case of using $H_2O_2$ solution as polishing condition 9, all the metals and intermetallic compounds thereof in the subject test example can be polished.

Accordingly, many kinds of metals, etc., used in a semiconductor device can be polished with one kind of the solid abrasive obtained by mixing and solidifying the abrasive grains of MnO, $MnO_2$, $Mn_2O_3$, or $Mn_3O_4$, the solvent, and the additive in the subject test example. Accordingly, in regard to the treatment of waste caused by polishing, since the kind of abrasive grain components used can be controlled to be minimum, the waste is easily treated, recovered and recycled.

Additionally, although the solid abrasive that contains no additive was employed in the subject test example, equivalent effect is obtained even if the additive is included.

Furthermore, in regard to test examples 6 through 10, in the polishing apparatus shown in FIG. 5, a polishing cloth, for example, IC1000 made by Rodel, may be applied on the upper surface plate 202, so that the object to be processed 205 contacts the polishing cloth.

Test example 11 of the embodiment according to the present invention mentioned below is an example of washing for a semiconductor device polished by using an abrasive containing abrasive grains of manganese oxide such as $MnO_2$, $Mn_2O_3$, $Mn_3O_4$, and MnO.

TEST EXAMPLE 11

The subject test example is an example of washing for a semiconductor device polished by using an abrasive containing abrasive grains of manganese oxide of $MnO_2$, $Mn_2O_3$, $Mn_3O_4$, or MnO.

For the abrasives, solid abrasives similar to samples 81 through 84 for test example 8 were used.

The objects to be processed, of which the top surface layers were a Cu film or an Al film with the thickness of 800 nm, were used similar to works 71 and 72 for the test example 7 (Works 121 and 122).

The polishing condition was similar to polishing condition 61 for test example 6 and $NHO_3$ solution adjusted at pH 2 was supplied on a surface to be polished by the additive feeder 206 in FIG. 5.

The polished object was washed with a washing fluid at the temperature of 23° C. for the time of supplying the washing liquid of 1 minute (washing conditions 11 through 17) by using a brush scrubber. Subsequently, washing with 0.25% of HF aqueous solution at the temperature of 23° C. for the supplying time of 20 seconds, further washing with water, and spin drying were applied to the washed object.

For the test, the top surface layer of the object to be processed was polished by approximately 200 nm under the above-mentioned conditions and subsequently washed on each washing condition. Then, the density of Mn atoms remaining on the surface of the processed object was measured. Additionally, the sheet resistance before and after the washing was measured so as to calculate the reduction of the film thickness and evaluate the amount of corrosion due to the washing.

(Abrasives)

Sample 121: abrasive grains of $MnO_2$ (20 wt %), a hold-back agent of ice, none of additive Sample 122: abrasive grains of $Mn_2O_3$ (20 wt % of solid content), a hold-back agent of ice, none of additive Sample 123: abrasive grains of $Mn_3O_4$ (20 wt % of solid content), a hold-back agent of ice, none of additive Sample 124: abrasive grains of MnO (20 wt % of solid content), a hold-back agent of ice, none of additive (Objects to be Processed)

Work 121: Cu (800 nm)/Ta (5 nm)/$SiO_2$ (200 nm)/Si substrate

Work 122: Al (800 nm)/TiN (5 nm)/$SiO_2$ (200 nm)/Si substrate (Washing Conditions)

Washing condition 11: washing liquid of methyl alcohol ($CH_3OH$), temperature of 23° C.

Washing condition 12: washing liquid of ethyl alcohol ($C_2H_5OH$), temperature of 23° C.

Washing condition 13: washing liquid of isopropyl alcohol (($CH_3)_2CHOH$), temperature of 23° C.

Washing condition 14: washing liquid of propyl alcohol ($CH_3CH_2CH_2OH$), temperature of 23° C.

Washing condition 15: washing liquid of 20 wt % of acetic acid ($CH_3COOH$) aqueous solution, temperature of 23° C.

Washing condition 16: washing liquid of 20 wt % of citric acid ($C_6H_8O_7$) aqueous solution, temperature of 23° C.

Washing condition 17: only washing with HF aqueous solution (0.25%), temperature of 23° C.

Washing condition 18: washing liquid of 5 wt % of hydrochloric acid (HCl)+5 wt % of $H_2O_2$, the balance being water, temperature of 23° C.

FIGS. 15 and 16 are tables showing the result of the subject test example. FIG. 15 shows the case where the top surface layer of the object to be processed was a Cu film. FIG. 16 shows the case where the top surface layer of the object to be processed was an Al film.

As referring to FIGS. 15 and 16, in the case of washing condition 17 as a comparison, the residual Mn atomic density was equal to or more than $5\times10^{13}$ atoms/m² for all the abrasives and objects to be processed. On the other hand, in washing conditions 11 through 16 of the subject test example according to the present invention, the residual Mn atomic density was equal to or less than $3\times10^{11}$ atoms/m² for all the abrasives and objects to be processed.

Also, as referring to FIGS. 15 and 16, the amount of corrosion for HCl+$H_2O_2$ on washing condition 18 as a comparison was equal to or more than 50 nm but the amount of corrosion was 30 nm for acetic acid aqueous solution on washing condition 15 at the maximum, or 10 nm on other washing conditions in the subject test sample according to the present invention. Additionally, on washing condition 17 as a comparison, since the amount of corrosion is small but the residual Mn atomic density is large, the abrasive grains of manganese oxide remaining on the surface of the object to be processed cannot be washed sufficiently.

Therefore, according to the present invention, after a semiconductor device is polished with an abrasive containing abrasive grains of manganese oxide, the abrasive grains of manganese oxide remaining on the semiconductor device can be eliminated and low-corrosive washing can be performed for a metal such as Cu and Al, etc., of the semiconductor device in such polishing process.

The test example 12 of the embodiment according to the present invention mentioned below is an example of washing with a washing liquid at high temperature of test example 11.

TEST EXAMPLE 12

Abrasives, objects to be processed, polishing conditions, and test methods were similar to those of test example 11.

Washing conditions were similar to those of test example 11 except the temperature of washing liquid of 80° C. (washing conditions 21 through 27). For the washing liquid, the washing liquids for test example 11 through 17 were employed.

(Washing Conditions)

Washing condition 21: washing liquid of methyl alcohol ($CH_3OH$), temperature of 80° C.

Washing condition 22: washing liquid of ethyl alcohol ($C_2H_5OH$), temperature of 80° C.

Washing condition 23: washing liquid of isopropyl alcohol (($CH_3)_2CHOH$), temperature of 80° C.

Washing condition 24: washing liquid of propyl alcohol ($CH_3CH_2CH_2OH$), temperature of 80° C.

Washing condition 25: washing liquid of 20 wt % of acetic acid ($CH_3COOH$) aqueous solution, temperature of 80° C.

Washing condition 26: washing liquid of 20 wt % of citric acid ($C_6H_8O_7$) aqueous solution, temperature of 80° C.

Washing condition 27 (comparison): only washing with HF aqueous solution (0.25%)

FIGS. 17 and 18 are tables showing the result of the test example. FIG. 17 shows the case of the top surface layer of the object to be processed being a Cu layer and FIG. 18 is the case of the top surface layer of the object to be processed being an Al layer.

As referring to FIGS. 17 and 18, in the case of washing condition 17 as a comparison, the residual manganese atomic density was equal to or more than $5\times10^{13}$ atoms/m² for all the abrasives and objects to be processed. On the other hand, on washing conditions 21 through 26 of the subject test example according to the present invention, the residual manganese atomic density was $5\times10^{11}$ atoms/m² for all the abrasives and objects to be processed.

Therefore, according to the present invention, as the temperature of the washing liquid is 80° C., the remaining abrasive grains of manganese oxide in the polishing process can be washed away more sufficiently. The temperature of the washing liquid is preferably equal to or more than 50° C., more preferably equal to or more than 80° C., from the viewpoint of the washing ability of the washing liquid.

As being clear from the above detailed description, according to the present invention, the abrasives have selectivity for polishing objects to be processed, and the detachment of the abrasive grains on a fixed grindstone of a dress jig can be avoided so as to prevent the object to be processed from being damaged.

For example, in the polishing process as a process of fabricating a semiconductor device, etc., the abrasives have selectivity for polishing a metal layer, etc., as a conductive layer of the semiconductor device and an insulation layer, and the detachment of the abrasive grains on a fixed grindstone of a dress jig can be avoided so as to prevent the semiconductor device from being damaged. Furthermore, since the additive is supplied to a polishing apparatus by a route different from the route of the abrasive, a wide variety of dispersing agents for abrasive grains of the abrasive can be selected for preservation of the abrasive without the consideration of the reactivity of the additive with the abrasive.

That is, since the additive is preserved in one supply container and the abrasive is preserved in another supply container and the additive is supplied to a polishing apparatus by a route different from the route for the abrasive, the reaction of the additive with the abrasive in the supply container and the supply route can be avoided and corrosion in the supply containers and supply routes can be also avoided.

According to the present invention, various metals such as Cu and Al and intermetallic compounds thereof used as a material for wiring of a semiconductor device, etc., can be polished and the kind of materials contained in waste in a polishing process can be controlled to be minimum so that the waste can be easily treated.

In particular, chemically stable metals such as Ir and Ta, etc., can be polished.

According to the present invention, the proportion of the abrasive grains contributing to polishing can be raised so as to reduce the amount of waste in the polishing process.

According to the present invention, the abrasive grains remaining on the processed object can be washed away sufficiently after polishing.

Although the preferable test examples according to the present invention are described above in detail, the abrasives and polishing methods according to the present invention are useful not only for fabrication of a semiconductor device but also for fabrication of a thin-film magnetic head, polishing of a lens, etc., and fabrication of a liquid-crystal panel, fabrication of a plasma display panel, fabrication of an exposure mask, and polishing for metal processing.

The present invention is not limited to the specifically disclosed embodiment, and variations and modifications may be made without departing from the scope of the present invention.

What is claimed is:

1. A washing method of washing an object polished with an abrasive that comprises abrasive grains selected from the group consisting of $MnO$, $MnO_2$, $Mn_2O_3$, $Mn_3O_4$, and a mixture thereof, wherein the polished object is washed with a washing liquid that comprises one of an organic acid and a lower alcohol by using a scrubber, and subsequently, washed with HF aqueous solution, further washed with water, and wherein spin drying is applied to the washed object.

2. The washing method as claimed in claim 1, wherein a temperature of the washing liquid is equal to or more than 50° C.

* * * * *

UNITED STATES PATENT AND TRADEMARK OFFICE
CERTIFICATE OF CORRECTION

PATENT NO. : 7,637,270 B2 Page 1 of 1
APPLICATION NO. : 11/474403
DATED : December 29, 2009
INVENTOR(S) : Sadahiro Kishii It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 672 days.

Signed and Sealed this

Ninth Day of November, 2010

David J. Kappos
*Director of the United States Patent and Trademark Office*